United States Patent
Li et al.

(10) Patent No.: US 11,735,664 B2
(45) Date of Patent: Aug. 22, 2023

(54) SOURCE/DRAIN REGIONS OF FINFET DEVICES AND METHODS OF FORMING SAME

(71) Applicant: Taiwan Semiconductor Manufacturing Co., Ltd., Hsinchu (TW)

(72) Inventors: Kun-Mu Li, Zhudong Township (TW); Heng-Wen Ting, Pingtung (TW); Yen-Ru Lee, Hsinchu (TW); Hsueh-Chang Sung, Zhubei (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 0 days.

(21) Appl. No.: 17/460,453

(22) Filed: Aug. 30, 2021

(65) Prior Publication Data

US 2021/0391456 A1 Dec. 16, 2021

Related U.S. Application Data

(62) Division of application No. 16/441,337, filed on Jun. 14, 2019, now Pat. No. 11,107,923.

(51) Int. Cl.
*H01L 29/78* (2006.01)
*H01L 29/08* (2006.01)
(Continued)

(52) U.S. Cl.
CPC ...... *H01L 29/785* (2013.01); *H01L 21/02129* (2013.01); *H01L 21/02532* (2013.01);
(Continued)

(58) Field of Classification Search
None
See application file for complete search history.

(56) References Cited

U.S. PATENT DOCUMENTS 9,093,530 B2 7/2015 Huang et al.
9,171,929 B2 10/2015 Lee et al.
(Continued)

*Primary Examiner* — Hung K Vu
(74) *Attorney, Agent, or Firm* — Slater Matsil, LLP

(57) ABSTRACT

A method includes forming a semiconductor fin over a substrate, etching the semiconductor fin to form a recess, wherein the recess extends into the substrate, and forming a source/drain region in the recess, wherein forming the source/drain region includes epitaxially growing a first semiconductor material on sidewalls of the recess, wherein the first semiconductor material includes silicon germanium, wherein the first semiconductor material has a first germanium concentration from 10 to 40 atomic percent, epitaxially growing a second semiconductor material over the first semiconductor material, the second semiconductor material including silicon germanium, wherein the second semiconductor material has a second germanium concentration that is greater than the first germanium concentration, and epitaxially growing a third semiconductor material over the second semiconductor material, the third semiconductor material including silicon germanium, wherein the third semiconductor material has a third germanium concentration that is smaller than the second germanium concentration.

20 Claims, 25 Drawing Sheets

(51) Int. Cl.
  *H01L 21/02* (2006.01)
  *H01L 29/66* (2006.01)
(52) U.S. Cl.
  CPC ...... *H01L 29/0847* (2013.01); *H01L 29/6681* (2013.01); *H01L 29/66545* (2013.01)

(56) References Cited

U.S. PATENT DOCUMENTS

| | | |
|---|---|---|
| 9,214,555 B2 | 12/2015 | Oxland et al. |
| 9,236,267 B2 | 1/2016 | De et al. |
| 9,520,482 B1 | 12/2016 | Chang et al. |
| 9,548,303 B2 | 1/2017 | Lee et al. |
| 9,564,489 B2 | 2/2017 | Yeo et al. |
| 9,576,814 B2 | 2/2017 | Wu et al. |
| 9,601,342 B2 | 3/2017 | Lee et al. |
| 9,608,116 B2 | 3/2017 | Ching et al. |
| 2016/0027918 A1* | 1/2016 | Kim .................... H01L 29/7848 257/401 |
| 2016/0300959 A1* | 10/2016 | Jenne ................ H01L 21/02667 |
| 2018/0337098 A1* | 11/2018 | Ando .............. H01L 21/823821 |
| 2019/0097006 A1* | 3/2019 | Li ....................... H01L 27/0924 |

* cited by examiner

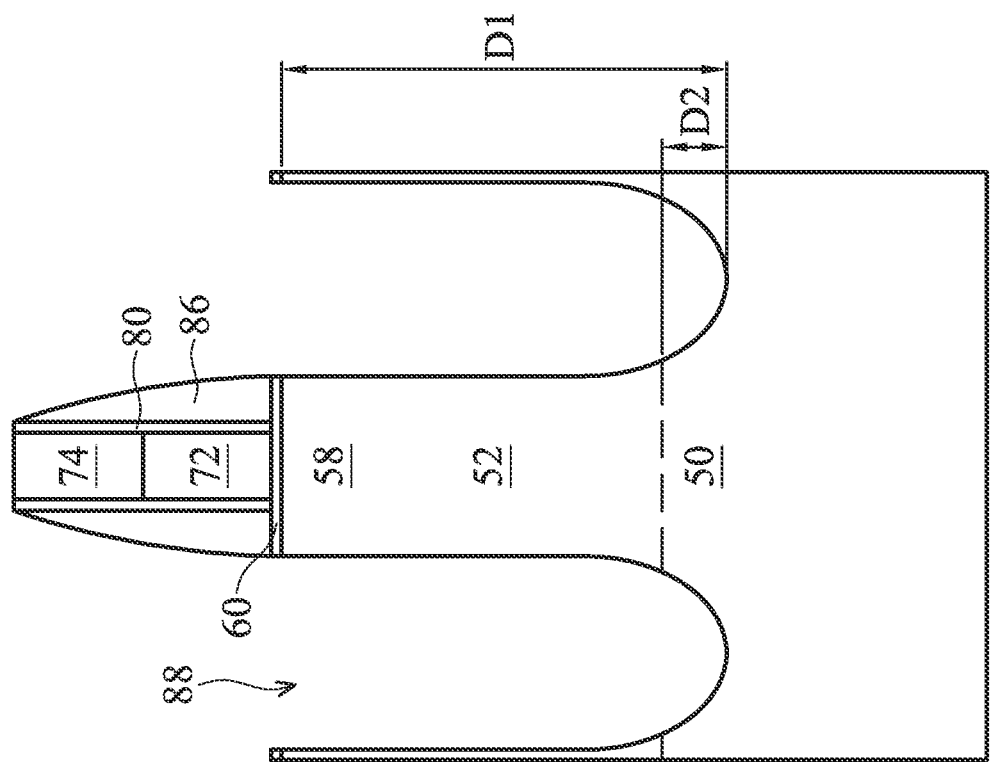
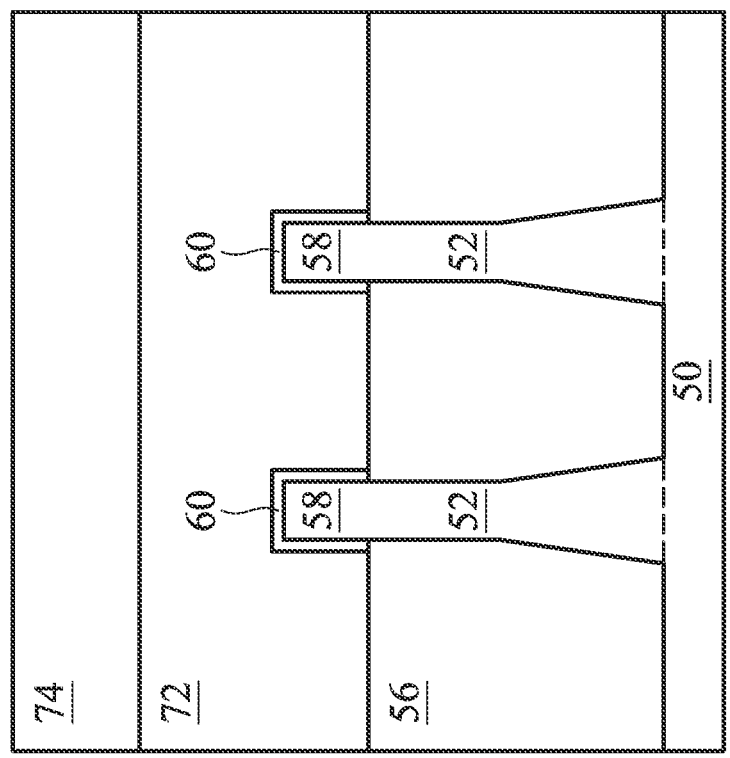
FIG. 10B
FIG. 10A

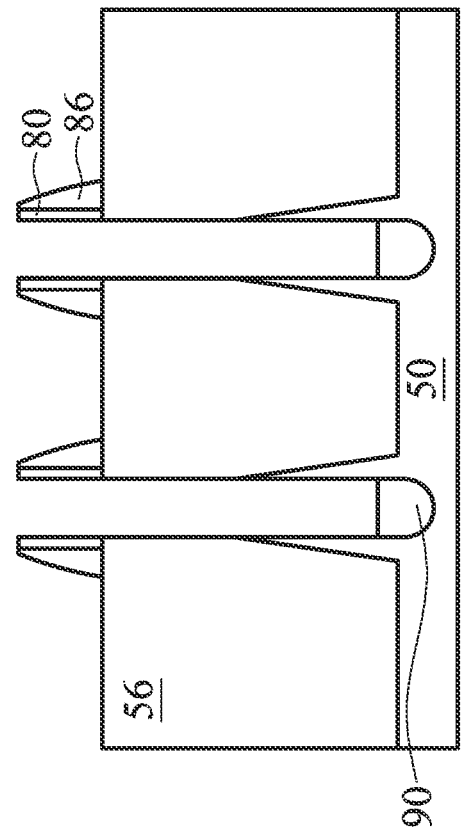
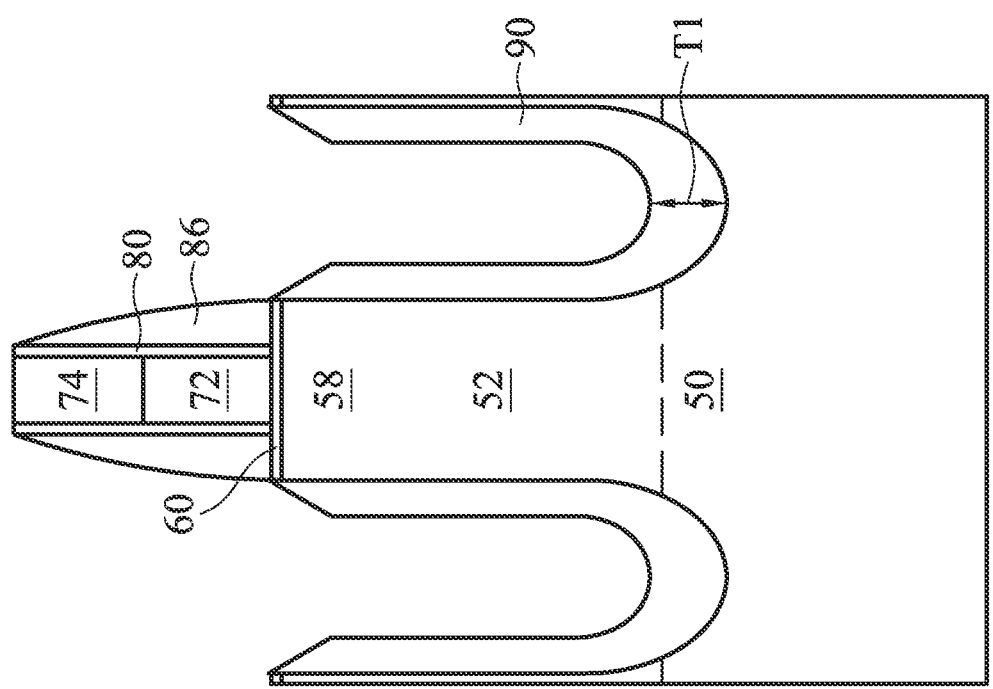
FIG. 11A
FIG. 11B

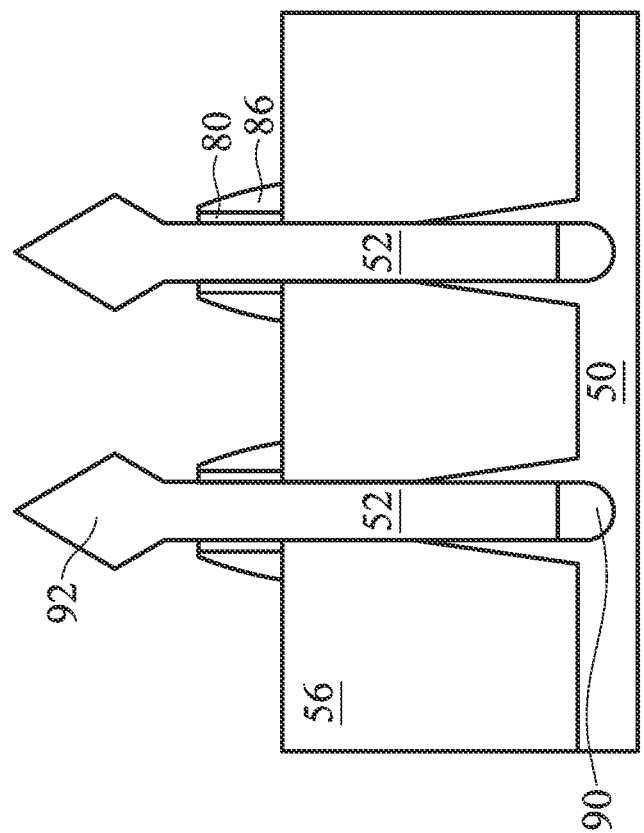
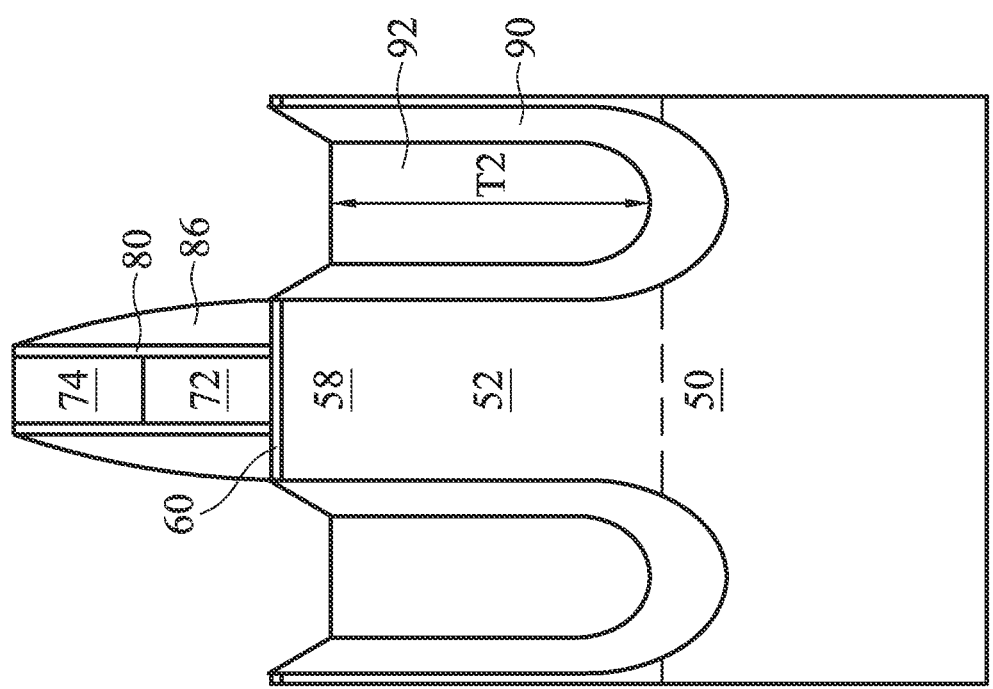
FIG. 12A
FIG. 12B

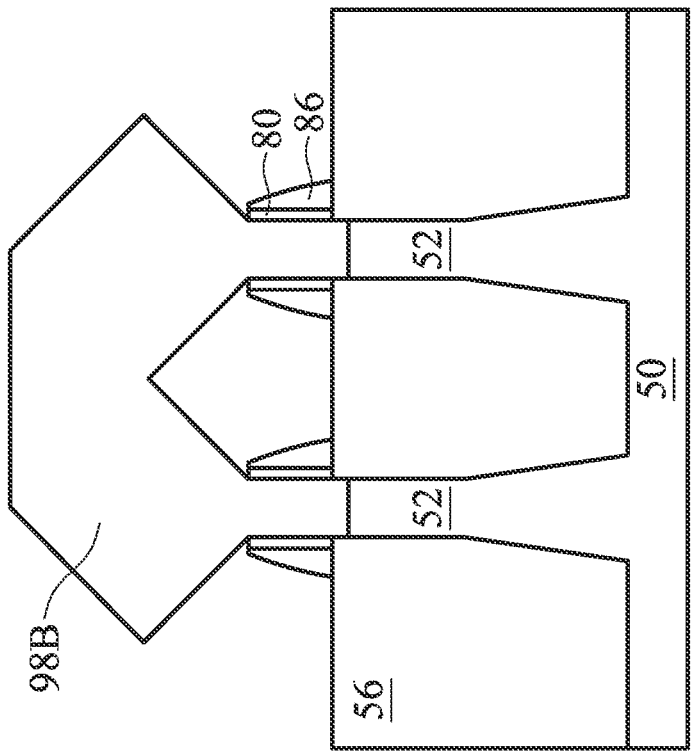
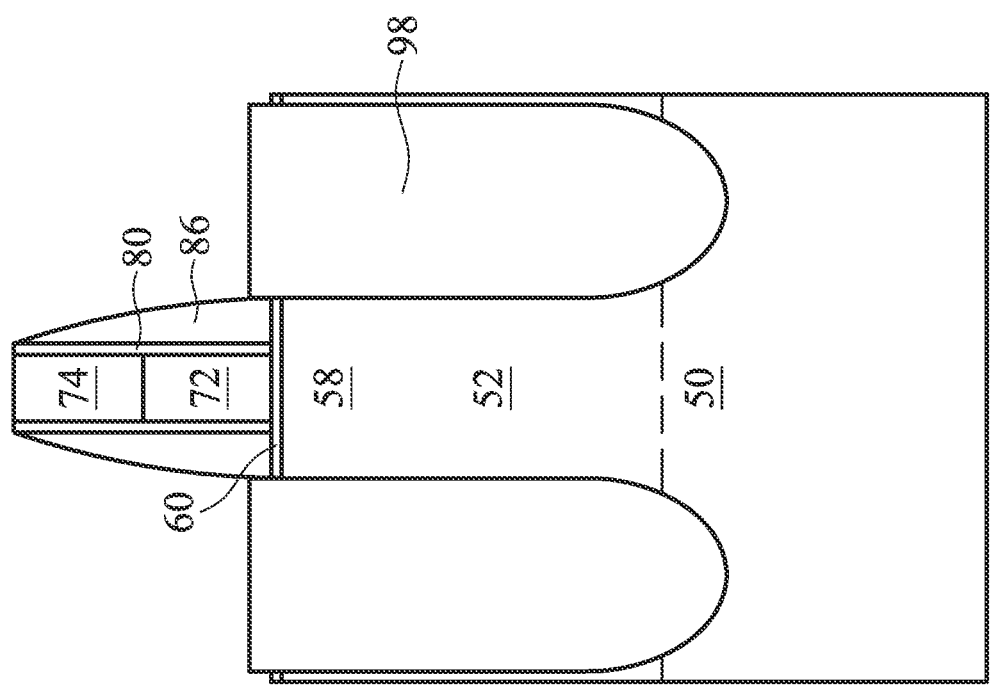
FIG. 14B
FIG. 14A

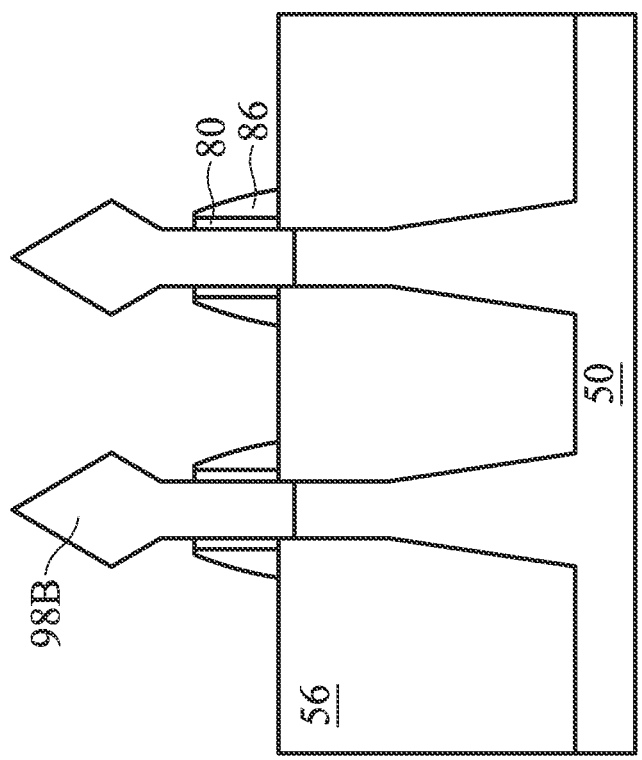

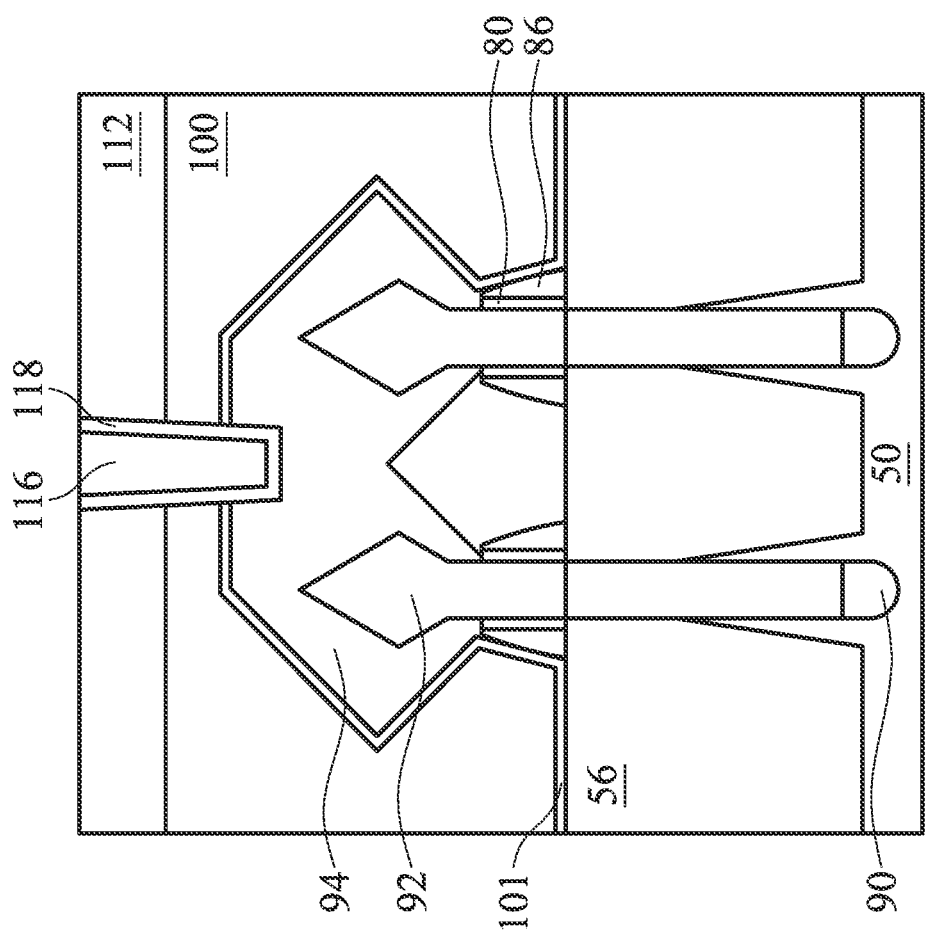

SOURCE/DRAIN REGIONS OF FINFET DEVICES AND METHODS OF FORMING SAME

PRIORITY CLAIM AND CROSS-REFERENCE

This application is a divisional of U.S. patent application Ser. No. 16/441,337, filed on Jun. 14, 2019, which application is hereby incorporated herein by reference.

BACKGROUND

Semiconductor devices are used in a variety of electronic applications, such as, for example, personal computers, cell phones, digital cameras, and other electronic equipment. Semiconductor devices are typically fabricated by sequentially depositing insulating or dielectric layers, conductive layers, and semiconductor layers of material over a semiconductor substrate, and patterning the various material layers using lithography to form circuit components and elements thereon.

The semiconductor industry continues to improve the integration density of various electronic components (e.g., transistors, diodes, resistors, capacitors, etc.) by continual reductions in minimum feature size, which allow more components to be integrated into a given area. However, as the minimum features sizes are reduced, additional problems arise that should be addressed.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIGS. 2, 3, 4, 5, 6, 7, 8A, 8B, 9A, 9B, 10A, 10B, 10C, 11A, 11B, 12A, 12B, 13A, 13B, 13C, 14A, 14B, 14C, 15A, 15B, 16A, 16B, 17A, 17B, 18A, 18B, 18C, 19A, 19B, 20A, 20B, and 20C are cross-sectional views of intermediate stages in the manufacturing of FinFETs, in accordance with some embodiments.

DETAILED DESCRIPTION

Figure 1:
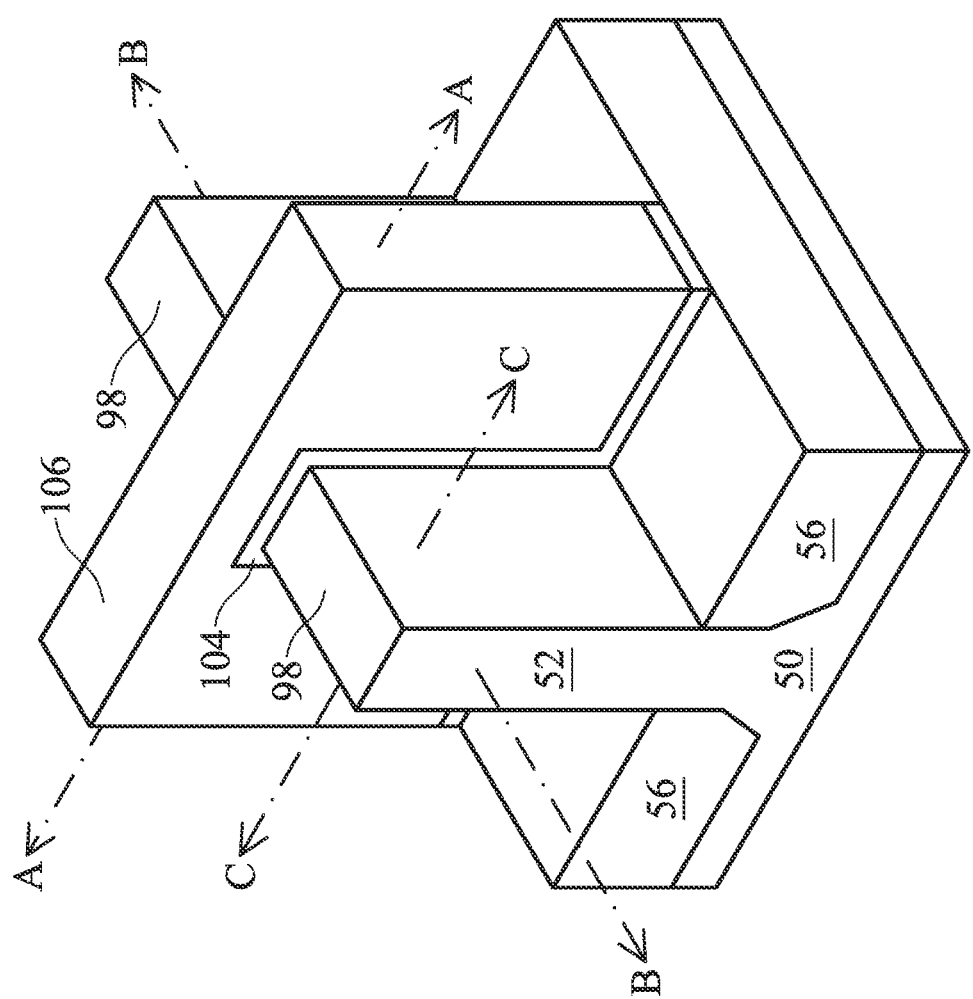
FIG. 1 illustrates an example of a FinFET in a three-dimensional view, in accordance with some embodiments.

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Various embodiments are discussed herein in a particular context, namely, forming epitaxial source/drain regions in an p-type FinFET transistor. However, various embodiments may be applied to other semiconductor devices/processes, such as planar transistors. In some embodiments, the epitaxial source/drain regions described herein includes a bottom layer of silicon germanium doped with boron. In some cases, an increased concentration of germanium in the bottom layer can block other dopants (e.g., boron) from diffusing into other regions of the FinFET, and a decreased concentration of boron can reduce the amount of boron that diffuses into other regions of the FinFET. The formation of a bottom layer in this manner can reduce leakage current of a FinFET. Additionally, the reduced leakage current allows for a deeper source/drain recess to be etched, which increases the overall volume of the epitaxial source/drain regions. By increasing the volume of the epitaxial source/drain regions, the turn-on current of a FinFET may be increased.

FIG. 1 illustrates an example of a FinFET in a three-dimensional view, in accordance with some embodiments. The FinFET comprises a fin 52 on a substrate 50 (e.g., a semiconductor substrate). Isolation regions 56 are disposed in the substrate 50, and the fin 52 protrudes above and from between neighboring isolation regions 56. Although the isolation regions 56 are described/illustrated as being separate from the substrate 50, as used herein the term "substrate" may be used to refer to just the semiconductor substrate or a semiconductor substrate inclusive of isolation regions. Additionally, although the fin 52 is illustrated as a single, continuous material as the substrate 50, the fin 52 and/or the substrate 50 may comprise a single material or a plurality of materials. In this context, the fin 52 refers to the portion extending between the neighboring isolation regions 56.

A gate dielectric layer 104 is along sidewalls and over a top surface of the fin 52, and a gate electrode 106 is over the gate dielectric layer 104. Source/drain regions 98 are disposed in opposite sides of the fin 52 with respect to the gate dielectric layer 104 and gate electrode 106. FIG. 1 further illustrates reference cross-sections that are used in later figures. Cross-section A-A is along a longitudinal axis of the gate electrode 106 and in a direction, for example, perpendicular to the direction of current flow between the source/drain regions 98 of the FinFET. Cross-section B-B is perpendicular to cross-section A-A and is along a longitudinal axis of the fin 52 and in a direction of, for example, a current flow between the source/drain regions 98 of the FinFET. Cross-section C-C is parallel to cross-section A-A and extends through a source/drain region of the FinFET. Subsequent figures refer to these reference cross-sections for clarity.

Some embodiments discussed herein are discussed in the context of FinFETs formed using a gate-last process. In other embodiments, a gate-first process may be used. Also, some embodiments contemplate aspects used in planar devices, such as planar FETs.

FIGS. 2 through 20A-C are cross-sectional views of intermediate stages in the manufacturing of FinFETs, in accordance with some embodiments. FIGS. 2 through 7 illustrate reference cross-section A-A illustrated in FIG. 1, except for multiple fins/FinFETs. FIGS. 8A, 9A, 10A, 15A, 16A, 17A, 18A, 19A, and 20A are illustrated along reference cross-section A-A illustrated in FIG. 1, and FIGS. 8B, 9B, 10B, 11A, 12A, 13A, 14A, 15B, 16B, 17B, 18B, 19B, 19C, and 20B are illustrated along a similar cross-section B-B illustrated in FIG. 1, except for multiple fins/FinFETs. FIGS. 10C, 11B, 12B, 13B, 13C, and 20C are illustrated along reference cross-section C-C illustrated in FIG. 1 in a PMOS region and FIGS. 14B and 14C are illustrated along reference cross-section C-C illustrated in FIG. 1 in an NMOS region, except for multiple fins/FinFETs.

Figure 2:
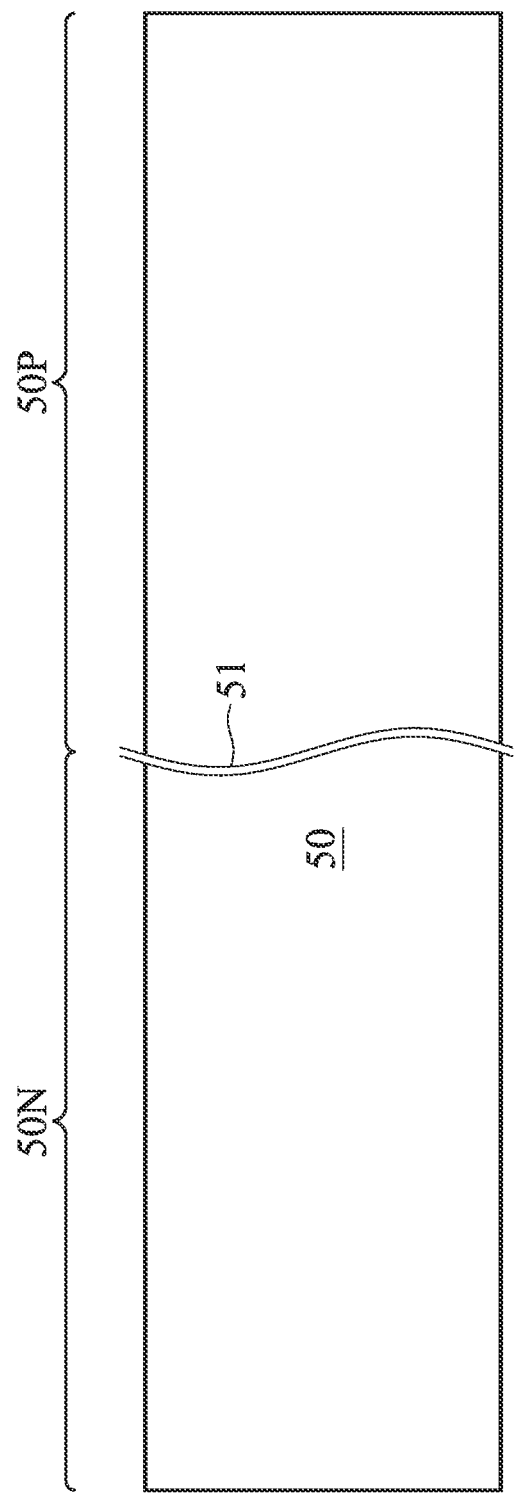

In FIG. 2, a substrate 50 is provided. The substrate 50 may be a semiconductor substrate, such as a bulk semiconductor, a semiconductor-on-insulator (SOI) substrate, or the like, which may be doped (e.g., with a p-type or an n-type dopant) or undoped. The substrate 50 may be a wafer, such as a silicon wafer. Generally, an SOI substrate is a layer of a semiconductor material formed on an insulator layer. The insulator layer may be, for example, a buried oxide (BOX) layer, a silicon oxide layer, or the like. The insulator layer is provided on a substrate, typically a silicon or glass substrate. Other substrates, such as a multi-layered or gradient substrate may also be used. In some embodiments, the semiconductor material of the substrate 50 may include silicon; germanium; a compound semiconductor including silicon carbide, gallium arsenide, gallium phosphide, indium phosphide, indium arsenide, and/or indium antimonide; an alloy semiconductor including silicon-germanium, gallium arsenide phosphide, aluminum indium arsenide, aluminum gallium arsenide, gallium indium arsenide, gallium indium phosphide, and/or gallium indium arsenide phosphide; or combinations thereof.

The substrate 50 has a region 50N and a region 50P. The region 50N can be for forming n-type devices, such as NMOS transistors, e.g., n-type FinFETs. The region 50P can be for forming p-type devices, such as PMOS transistors, e.g., p-type FinFETs. The region 50N may be physically separated from the region 50P (as illustrated by divider 51), and any number of device features (e.g., other active devices, doped regions, isolation structures, etc.) may be disposed between the region 50N and the region 50P.

Figure 3:
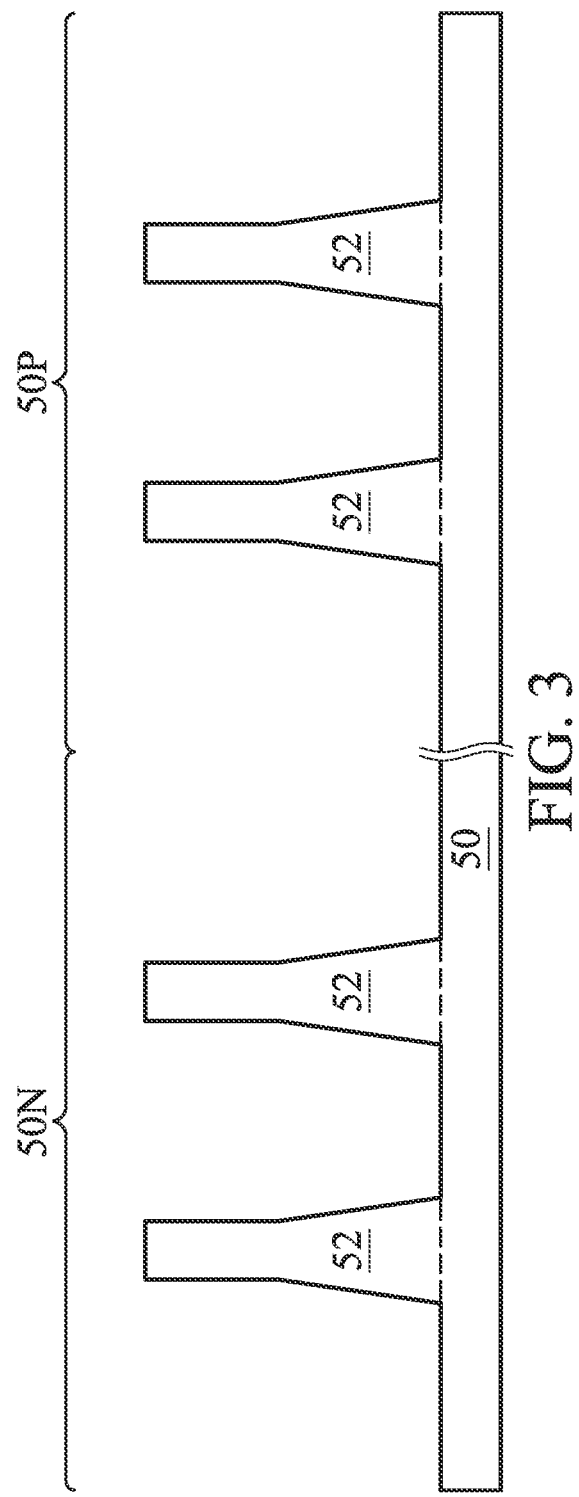

In FIG. 3, fins 52 are formed in the substrate 50. The fins 52 are semiconductor strips. In some embodiments, the fins 52 may be formed in the substrate 50 by etching trenches in the substrate 50. The etching may be any acceptable etch process, such as a reactive ion etch (RIE), neutral beam etch (NBE), the like, or a combination thereof. The etch may be anisotropic.

The fins may be patterned by any suitable method. For example, the fins may be patterned using one or more photolithography processes, including double-patterning or multi-patterning processes. Generally, double-patterning or multi-patterning processes combine photolithography and self-aligned processes, allowing patterns to be created that have, for example, pitches smaller than what is otherwise obtainable using a single, direct photolithography process. For example, in one embodiment, a sacrificial layer is formed over a substrate and patterned using a photolithography process. Spacers are formed alongside the patterned sacrificial layer using a self-aligned process. The sacrificial layer is then removed, and the remaining spacers may then be used to pattern the fins. In some embodiments, the mask (or other layer) may remain on the fins 52.

Figure 4:
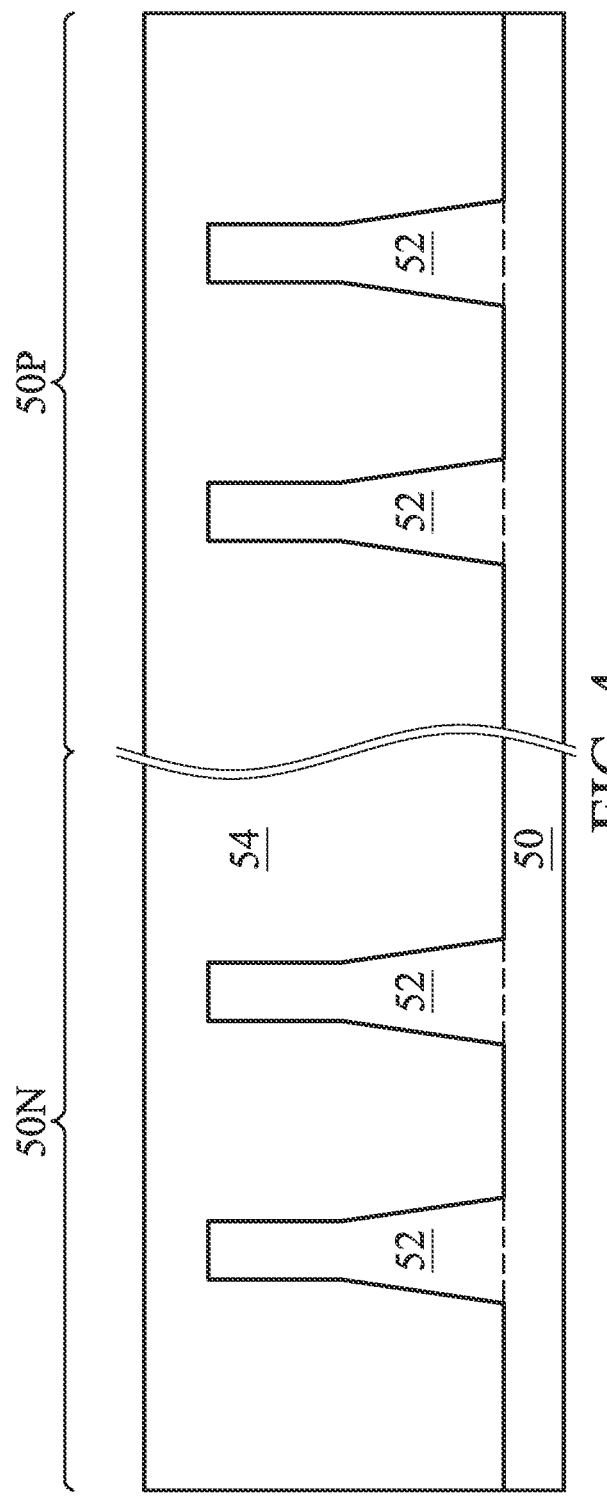

In FIG. 4, an insulation material 54 is formed over the substrate 50 and between neighboring fins 52. The insulation material 54 may be an oxide, such as silicon oxide, a nitride, the like, or a combination thereof, and may be formed by a high density plasma chemical vapor deposition (HDP-CVD), a flowable CVD (FCVD) (e.g., a CVD-based material deposition in a remote plasma system and post curing to make it convert to another material, such as an oxide), the like, or a combination thereof. Other insulation materials formed by any acceptable process may be used. In the illustrated embodiment, the insulation material 54 is silicon oxide formed by a FCVD process. An anneal process may be performed once the insulation material is formed. In an embodiment, the insulation material 54 is formed such that excess insulation material 54 covers the fins 52. Although the insulation material 54 is illustrated as a single layer, some embodiments may utilize multiple layers. For example, in some embodiments a liner (not shown) may first be formed along a surface of the substrate 50 and the fins 52. Thereafter, a fill material, such as those discussed above may be formed over the liner.

Figure 5:
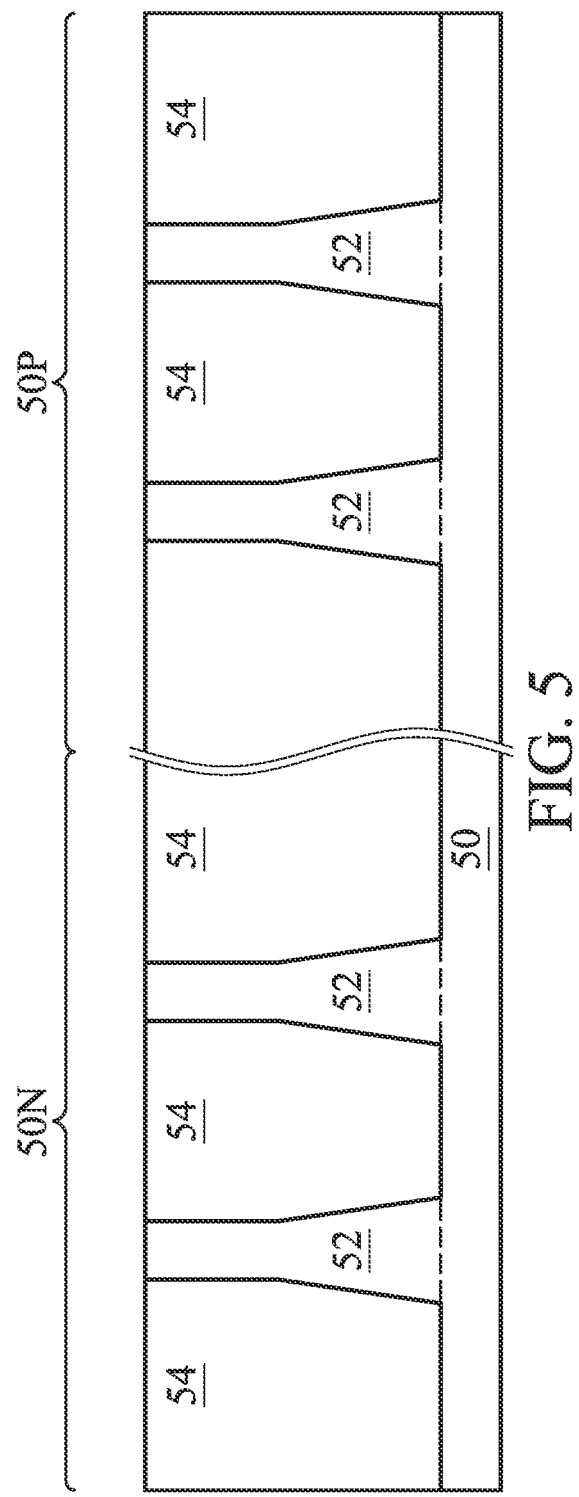

In FIG. 5, a removal process is applied to the insulation material 54 to remove excess insulation material 54 over the fins 52. In some embodiments, a planarization process such as a chemical mechanical polish (CMP), an etch-back process, combinations thereof, or the like may be utilized. The planarization process exposes the fins 52 such that top surfaces of the fins 52 and the insulation material 54 are level after the planarization process is complete. In embodiments in which a mask remains on the fins 52, the planarization process may expose the mask or remove the mask such that top surfaces of the mask or the fins 52, respectively, and the insulation material 54 are level after the planarization process is complete.

Figure 6:
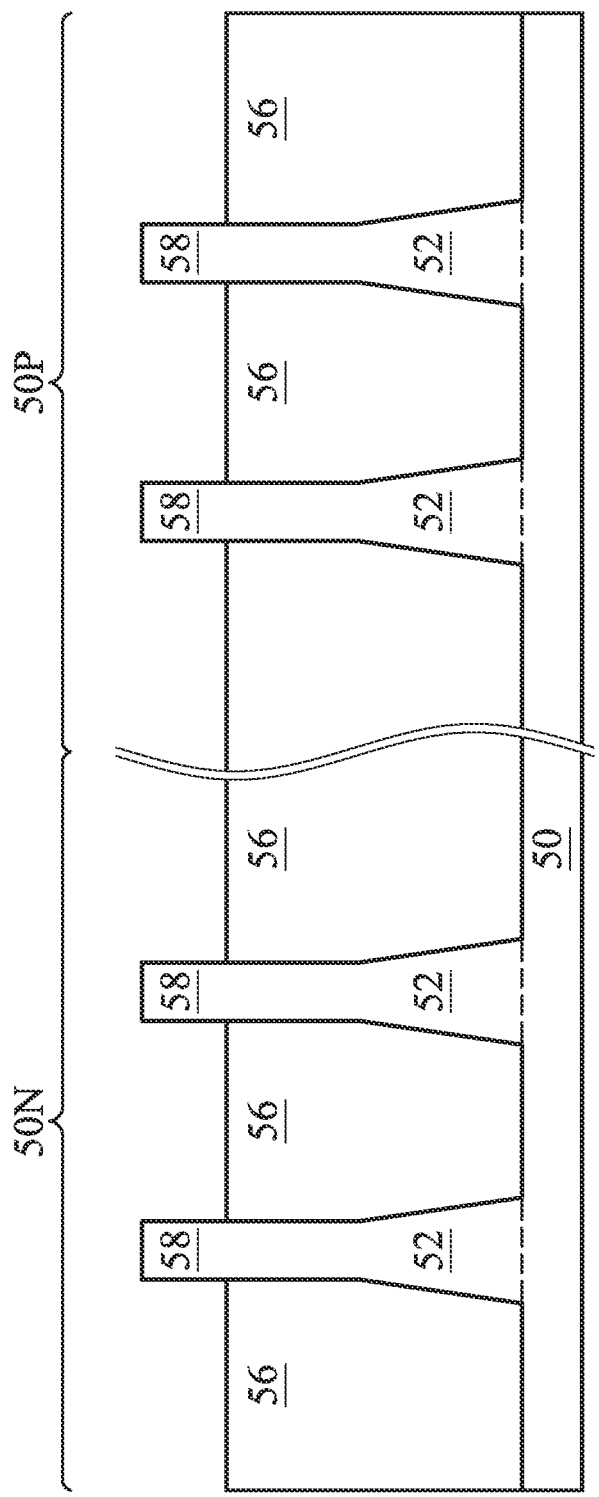

In FIG. 6, the insulation material 54 is recessed to form Shallow Trench Isolation (STI) regions 56. The insulation material 54 is recessed such that upper portions of fins 52 in the region 50N and in the region 50P protrude from between neighboring STI regions 56. Further, the top surfaces of the STI regions 56 may have a flat surface as illustrated, a convex surface, a concave surface (such as dishing), or a combination thereof. The top surfaces of the STI regions 56 may be formed flat, convex, and/or concave by an appropriate etch. The STI regions 56 may be recessed using an acceptable etching process, such as one that is selective to the material of the insulation material 54 (e.g., etches the material of the insulation material 54 at a faster rate than the material of the fins 52). For example, an oxide removal using, for example, dilute hydrofluoric (dHF) acid may be used.

The process described with respect to FIGS. 2 through 6 is just one example of how the fins 52 may be formed. In some embodiments, the fins may be formed by an epitaxial growth process. For example, a dielectric layer can be formed over a top surface of the substrate 50, and trenches can be etched through the dielectric layer to expose the underlying substrate 50. Homoepitaxial structures can be epitaxially grown in the trenches, and the dielectric layer can be recessed such that the homoepitaxial structures protrude from the dielectric layer to form fins. Additionally, in some embodiments, heteroepitaxial structures can be used for the fins 52. For example, the fins 52 in FIG. 5 can be recessed, and a material different from the fins 52 may be epitaxially grown over the recessed fins 52. In such embodiments, the fins 52 comprise the recessed material as well as the epitaxially grown material disposed over the recessed material. In an even further embodiment, a dielectric layer can be formed over a top surface of the substrate 50, and trenches can be etched through the dielectric layer. Heteroepitaxial structures can then be epitaxially grown in the trenches using a material different from the substrate 50, and the dielectric layer can be recessed such that the heteroepitaxial structures protrude from the dielectric layer to form the fins 52. In some embodiments where homoepitaxial or heteroepitaxial structures are epitaxially grown, the epitaxially grown materials may be in situ doped during growth, which may obviate prior and subsequent implantations although in situ and implantation doping may be used together.

Still further, it may be advantageous to epitaxially grow a material in region 50N (e.g., an NMOS region) different from the material in region 50P (e.g., a PMOS region). In various embodiments, upper portions of the fins 52 may be formed from silicon-germanium ($Si_xGe_{1-x}$, where x can be in the range of 0 to 1). For example, in some embodiments, portions of the fins 52 formed in region 50P may be formed from silicon germanium having a composition that is between about 10% and about 50% germanium. In other embodiments, upper portions of the fins 52 may be formed from silicon carbide, pure or substantially pure germanium, a III-V compound semiconductor, a II-VI compound semiconductor, or the like. For example, the available materials for forming III-V compound semiconductor include, but are not limited to, indium arsenide, aluminum arsenide, gallium arsenide, indium phosphide, gallium nitride, indium gallium arsenide, indium aluminum arsenide, gallium antimonide, aluminum antimonide, aluminum phosphide, gallium phosphide, and the like.

Further in FIG. 6, appropriate wells (not shown) may be formed in the fins 52 and/or the substrate 50. In some embodiments, a P well may be formed in the region 50N, and an N well may be formed in the region 50P. In some embodiments, a P well or an N well are formed in both the region 50N and the region 50P.

In the embodiments with different well types, the different implant steps for the region 50N and the region 50P may be achieved using a photoresist or other masks (not shown). For example, a photoresist may be formed over the fins 52 and the STI regions 56 in the region 50N. The photoresist is patterned to expose the region 50P of the substrate 50, such as a PMOS region. The photoresist can be formed by using a spin-on technique and can be patterned using acceptable photolithography techniques. Once the photoresist is patterned, an n-type impurity implant is performed in the region 50P, and the photoresist may act as a mask to substantially prevent n-type impurities from being implanted into the region 50N, such as an NMOS region. The n-type impurities may be phosphorus, arsenic, antimony, or the like implanted in the region to a concentration of equal to or less than 1E18 atoms/$cm^3$, such as between about 1E16 atoms/$cm^3$ and about 1E18 atoms/$cm^3$. After the implant, the photoresist is removed, such as by an acceptable ashing process.

Following the implanting of the region 50P, a photoresist is formed over the fins 52 and the STI regions 56 in the region 50P. The photoresist is patterned to expose the region 50N of the substrate 50, such as the NMOS region. The photoresist can be formed by using a spin-on technique and can be patterned using acceptable photolithography techniques. Once the photoresist is patterned, a p-type impurity implant may be performed in the region 50N, and the photoresist may act as a mask to substantially prevent p-type impurities from being implanted into the region 50P, such as the PMOS region. The p-type impurities may be boron, boron fluoride, indium, or the like implanted in the region to a concentration of equal to or less than 1E20 atoms/$cm^3$, such as a dopant concentration between about 1E17 atoms/$cm^3$ and about 1E20 atoms/$cm^3$. After the implant, the photoresist may be removed, such as by an acceptable ashing process.

After the implants of the region 50N and the region 50P, an anneal may be performed to repair implant damage and to activate the p-type and/or n-type impurities that were implanted. In some embodiments, the grown materials of epitaxial fins may be in situ doped during growth, which may obviate the implantations, although in situ and implantation doping may be used together.

Figure 7:
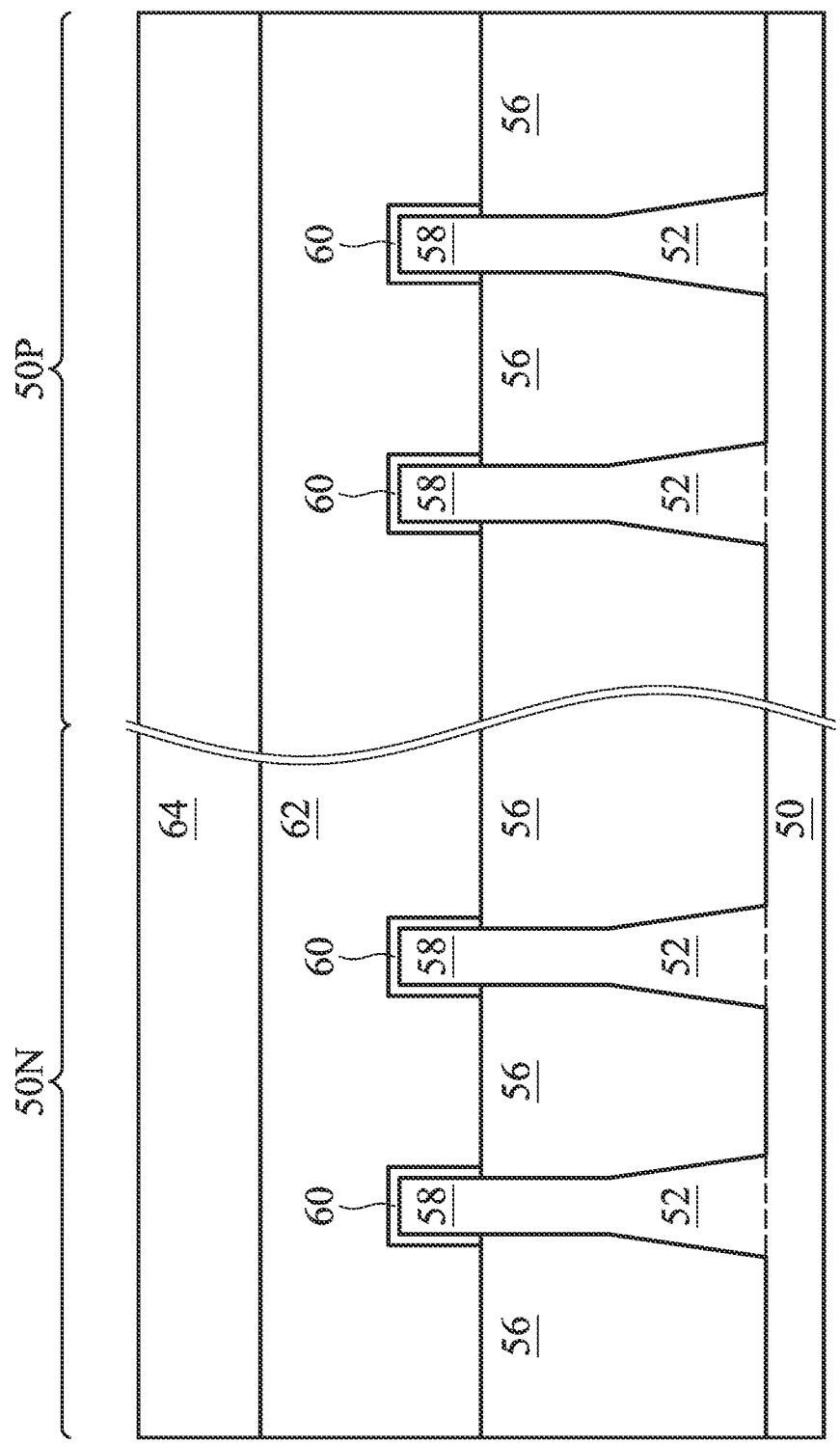

In FIG. 7, a dummy dielectric layer 60 is formed on the fins 52. The dummy dielectric layer 60 may be, for example, silicon oxide, silicon nitride, a combination thereof, or the like, and may be deposited or thermally grown according to acceptable techniques. A dummy gate layer 62 is formed over the dummy dielectric layer 60, and a mask layer 64 is formed over the dummy gate layer 62. The dummy gate layer 62 may be deposited over the dummy dielectric layer 60 and then planarized, such as by a CMP. The mask layer 64 may be deposited over the dummy gate layer 62. The dummy gate layer 62 may be a conductive or non-conductive material and may be selected from a group including amorphous silicon, polycrystalline-silicon (polysilicon), poly-crystalline silicon-germanium (poly-SiGe), metallic nitrides, metallic silicides, metallic oxides, and metals. The dummy gate layer 62 may be deposited by physical vapor deposition (PVD), CVD, sputter deposition, or other techniques known and used in the art for depositing the selected material. The dummy gate layer 62 may be made of other materials that have a high etching selectivity from the etching of isolation regions. The mask layer 64 may include, for example, silicon nitride, silicon oxynitride, or the like. In this example, a single dummy gate layer 62 and a single mask layer 64 are formed across the region 50N and the region 50P. It is noted that the dummy dielectric layer 60 is shown covering only the fins 52 for illustrative purposes only. In some embodiments, the dummy dielectric layer 60 may be deposited such that the dummy dielectric layer 60 covers the STI regions 56, extending between the dummy gate layer 62 and the STI regions 56.

FIGS. 8A through 20C illustrate various additional steps in the manufacturing of embodiment devices. FIGS. 8A through 20C illustrate features in either of the region 50N and the region 50P. For example, the structures illustrated in FIGS. 8A through 20C may be applicable to both the region 50N and the region 50P. Differences (if any) in the structures of the region 50N and the region 50P are described in the text accompanying each figure.

Figure 8B:
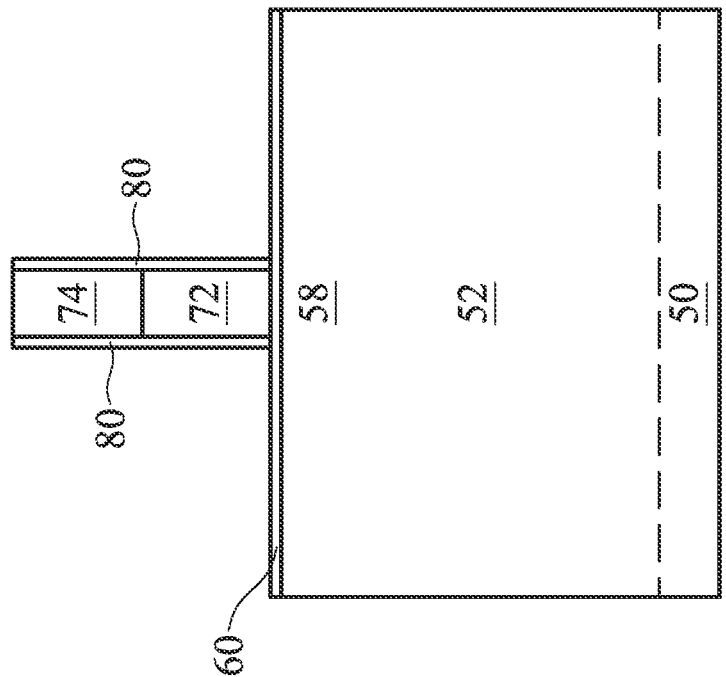
Figure 8A:
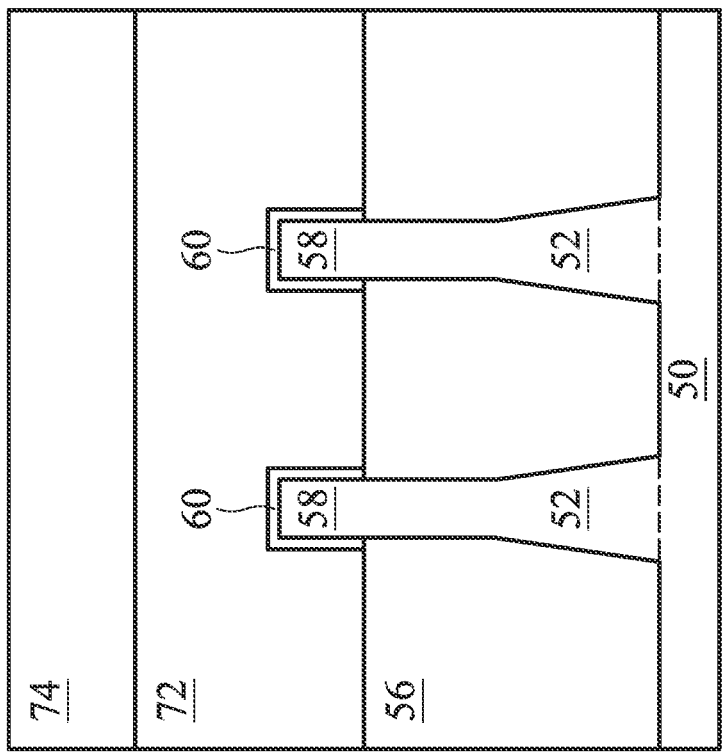

In FIGS. 8A and 8B, the mask layer 64 (see FIG. 7) may be patterned using acceptable photolithography and etching techniques to form masks 74. The pattern of the masks 74 then may be transferred to the dummy gate layer 62. In some embodiments (not illustrated), the pattern of the masks 74 may also be transferred to the dummy dielectric layer 60 by an acceptable etching technique to form dummy gates 72. The dummy gates 72 cover respective channel regions 58 of the fins 52. The pattern of the masks 74 may be used to physically separate each of the dummy gates 72 from adjacent dummy gates. The dummy gates 72 may also have a lengthwise direction substantially perpendicular to the lengthwise direction of respective epitaxial fins 52.

Further in FIGS. 8A and 8B, gate seal spacers 80 can be formed on exposed surfaces of the dummy gates 72, the masks 74, and/or the fins 52. A thermal oxidation or a deposition followed by an anisotropic etch may form the gate seal spacers 80. The gate seal spacers 80 may be formed of silicon oxide, silicon nitride, silicon oxynitride, or the like.

After the formation of the gate seal spacers 80, implants for lightly doped source/drain (LDD) regions (not explicitly illustrated) may be performed. In the embodiments with different device types, similar to the implants discussed above in FIG. 6, a mask, such as a photoresist, may be formed over the region 50N, while exposing the region 50P, and appropriate type (e.g., p-type) impurities may be implanted into the exposed fins 52 in the region 50P. The mask may then be removed. Subsequently, a mask, such as a photoresist, may be formed over the region 50P while exposing the region 50N, and appropriate type impurities (e.g., n-type) may be implanted into the exposed fins 52 in the region 50N. The mask may then be removed. The n-type impurities may be the any of the n-type impurities previously discussed, and the p-type impurities may be the any of the p-type impurities previously discussed. The lightly doped source/drain regions may have a concentration of impurities of from about $10^{15}$ cm$^{-3}$ to about $10^{19}$ cm$^{-3}$. An anneal may be used to repair implant damage and to activate the implanted impurities.

Figure 9B:
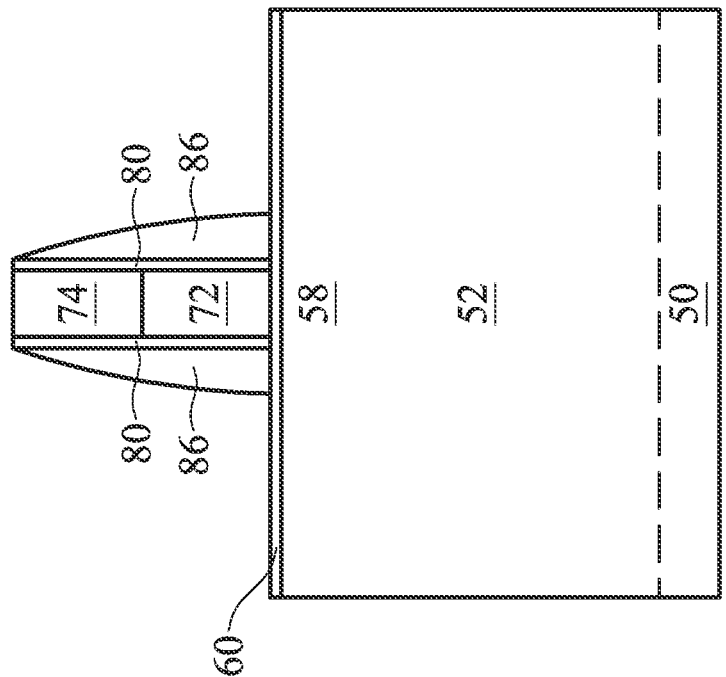
Figure 9A:
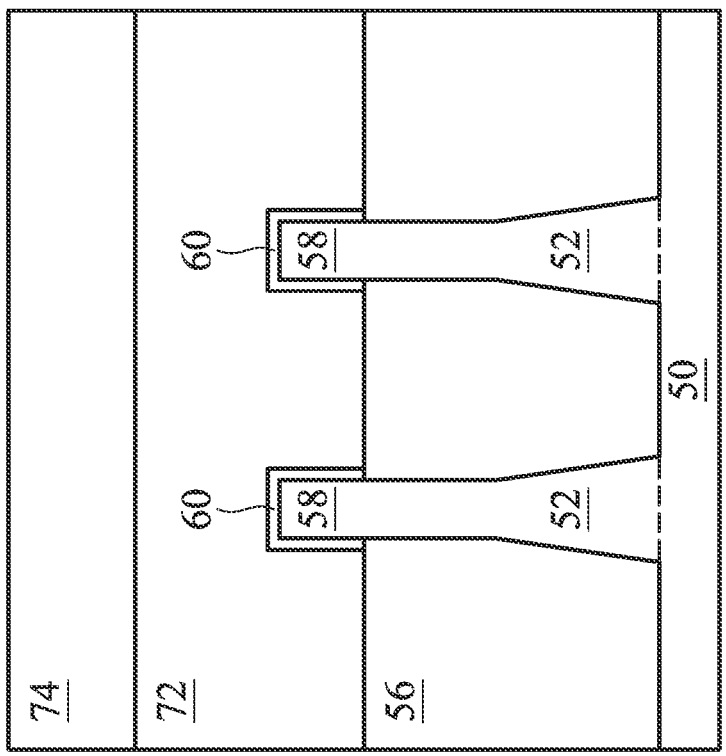

In FIGS. 9A and 9B, gate spacers 86 are formed on the gate seal spacers 80 along sidewalls of the dummy gates 72 and the masks 74. The gate spacers 86 may be formed by conformally depositing an insulating material and subsequently anisotropically etching the insulating material. The insulating material of the gate spacers 86 may be silicon oxide, silicon nitride, silicon oxynitride, silicon carbonitride, a combination thereof, or the like.

It is noted that the above disclosure generally describes a process of forming spacers and LDD regions. Other processes and sequences may be used. For example, fewer or additional spacers may be utilized, different sequence of steps may be utilized (e.g., the gate seal spacers 80 may not be etched prior to forming the gate spacers 86, yielding "L-shaped" gate seal spacers, spacers may be formed and removed, and/or the like. Furthermore, the n-type and p-type devices may be formed using a different structures and steps. For example, LDD regions for n-type devices may be formed prior to forming the gate seal spacers 80 while the LDD regions for p-type devices may be formed after forming the gate seal spacers 80.

Figure 10C:
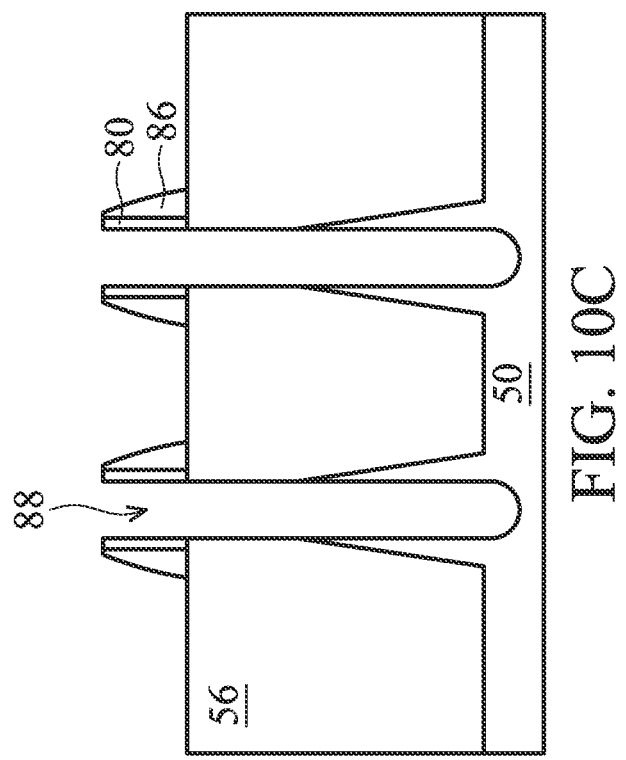

FIGS. 10A-13C illustrate various steps in forming source/drain regions 98A in the fins 52 in the region 50P. As illustrated in FIGS. 10A-13C, the source/drain regions 98A in the region 50P may be formed using a multi-step epitaxial deposition process. The source/drain regions 98A in the region 50P, e.g., the PMOS region, may be formed by masking the region 50N, e.g., the NMOS region. Recesses 88 are then formed in the fins 52 and the substrate 50 by etching source/drain regions of the fins 52 in the region 50P, as illustrated in FIGS. 10A-10C.

As shown in FIGS. 10B-C, the recesses 88 may be etched such that the recesses 88 extend into the substrate 50. For example, in some embodiments in which the fins 52 comprise silicon germanium and are formed over a substrate 50 comprising silicon, the recesses 88 may extend through the silicon germanium material of the fins 52 and into the silicon material of the substrate 50. In other embodiments, the fins 52 and/or the substrate 50 may comprise different materials than this example. The recesses 88 may have a depth D1 from about 30 nm to about 70 nm, such as about 50 nm. In some embodiments, the recesses 88 may extend into the substrate 50 a distance D2 that is between about 0 nm and about 10 nm, though the recesses 88 may extend into the substrate 50 other distances in other embodiments. By forming recesses 88 that extend farther into the substrate 50, the volume of the epitaxial source drain regions (see FIGS. 11A-B through 13A-C) that are formed in the recesses 88 may be increased. In some cases, by increasing the volume of the epitaxial source/drain regions of a FinFET device, the electrical performance of the FinFET device may be improved. For example, the turn-on current of a FinFET device may be increased by increasing the volume of the epitaxial source/drain regions of the FinFET device. In some cases, the turn-on current may be increased by as much as 10% by increasing the volume of the epitaxial source/drain regions.

In FIGS. 11A-B, a first source/drain layer 90 is epitaxially grown in the recesses 88. The first source/drain layer 90 may be a single layer or may include multiple layers. The first source/drain layer 90 may be grown on the sidewalls and bottom surfaces of the recesses 88, as shown in FIGS. 11A-B. In some embodiments, the first source/drain layer 90 is grown having a thickness T1 that is between about 3 nm and about 20 nm. In some embodiments, the first source/drain layer 90 is epitaxially grown in the recesses 88 using metal-organic CVD (MOCVD), molecular beam epitaxy (MBE), liquid phase epitaxy (LPE), vapor phase epitaxy (VPE), selective epitaxial growth (SEG), a combination thereof, or the like. The first source/drain layer 90 may be grown at a temperature between about 400° C. and about 800° C. and at a process pressure between about 0.5 mTorr and about 600 Torr. In some embodiments, the first source/drain layer 90 may be grown using gases (e.g., as precursors, carrier gases, or mixtures thereof) such as $SiH_4$, $Si_2H_6$, dichlorosilane, $GeH_4$, $Ge_2H_6$, $B_2H_6$, HCl, $Cl_2$, Ar, $H_2$, $N_2$, the like, or combinations thereof.

The first source/drain layer 90 may comprise any acceptable materials, such as any materials that are appropriate for p-type FinFETs. In some embodiments, the first source/drain layer 90 is formed from silicon germanium, which may be doped or undoped. In some embodiments, the first source/drain layer 90 is formed from silicon germanium having atomic percentage of germanium that is between about 10% and about 40%. In some embodiments, the outer regions of the first source/drain layer 90 (e.g., the regions near the fins 52 and substrate 50) may have a smaller concentration of germanium than the inner regions of the first source/drain layer 90. For example, in some embodiments, the outer regions of the first source/drain layer 90 may have an atomic concentration of germanium that is between about 10% and about 25%, and the inner regions of the first source/drain layer 90 may have an atomic concentration of germanium that is between about 25% and about 40%. In some embodiments, the concentration of germanium transitions smoothly between different regions. In some cases, germanium in the first source/drain layer 90 may block dopant diffusion within the first source/drain layer 90. Thus, increasing the concentration of germanium within the first source/drain layer 90 can reduce the amount of out-diffusion of dopants from within the epitaxial source/drain regions 98A to the fins 52 or substrate 50. Dopants diffusing from an epitaxial source/drain region into a fin or substrate can cause leakage that decreases device performance, particularly when the epitaxial source/drain region extends near or into the substrate. By using a higher concentration of germanium to reduce dopant diffusion, the epitaxial source/drain regions 98A may be formed extending into the substrate 50 without causing leakage that degrades device performance. In some cases, the use of germanium within the first source/drain layer 90 can reduce leakage by as much as about 15% to about 40%. In this manner, the recesses 88 may be etched deeper to increase the volume of the epitaxial source/drain regions 98A while reducing leakage effects.

In some embodiments, the first source/drain layer 90 may have a dopant concentration between about 1E19 atoms/cm$^3$ and about 1E21 atoms/cm$^3$. The first source/drain layer 90 may be doped by one or more suitable p-type impurities, such as boron, BF$_2$, indium, or the like. The first source/drain layer 90 may be implanted with dopants using in situ doping during growth, or using a process similar to the process previously discussed for forming lightly-doped source/drain regions, followed by an anneal. In some embodiments, the outer regions of the first source/drain layer 90 may have a smaller concentration of dopants than the inner regions of the first source/drain layer 90. For example, in some embodiments, the outer regions of the first source/drain layer 90 may have a concentration of dopants that is between about 1E19 atoms/cm$^3$ and about 1E20 atoms/cm$^3$, and the inner regions of the first source/drain layer 90 may have a concentration of dopants that is between about 1E20 atoms/cm$^3$ and about 1E21 atoms/cm$^3$. In some embodiments, the concentration of dopants transitions smoothly between different regions. In some cases, forming the first/source/drain layer 90 with a lower concentration of dopants can reduce the amount of dopants that diffuse into the fins 52 or substrate 50.

In FIGS. 12A and 12B, a second source/drain layer 92 is epitaxially grown in the recesses 88 over the first source/drain layer 90. The second source/drain layer 92 may comprise any acceptable materials, such as any materials that are appropriate for p-type FinFETs. For example, the second source/drain layer 92 may comprise materials exerting a compressive strain in the channel region 58, such as SiGe, SiGeB, Ge, GeSn, or the like. In some embodiments, the second source/drain layer 92 is formed from silicon germanium, which may be doped or undoped. In some embodiments, the second source/drain layer 92 may comprise silicon germanium having an atomic percentage of germanium that is between about 20% and about 80%. In some embodiments, the second source/drain layer 92 has a greater atomic percentage of germanium than the first source/drain layer 90. The second source/drain layer 92 may be implanted with dopants using in situ doping during growth, or using a process similar to the process previously discussed for forming lightly-doped source/drain regions, followed by an anneal. For example, the second source/drain layer 92 may have a concentration of dopants that is between about 5E20 atoms/cm$^3$ and about 1E22 atoms/cm$^3$. The dopants may include p-type impurities such as boron, BF$_2$, indium, or the like. In some embodiments, the second source/drain layer 92 may have a greater concentration of dopants than the first source/drain layer 90. As illustrated in FIGS. 12A and 12B, the second source/drain layer 92 may have facets. Although the second source/drain layer 92 is illustrated in FIGS. 12A and 12B as being unmerged, in some embodiments, the facets may cause adjacent second source/drain layers 92 to merge.

Figures 13A, 13B:
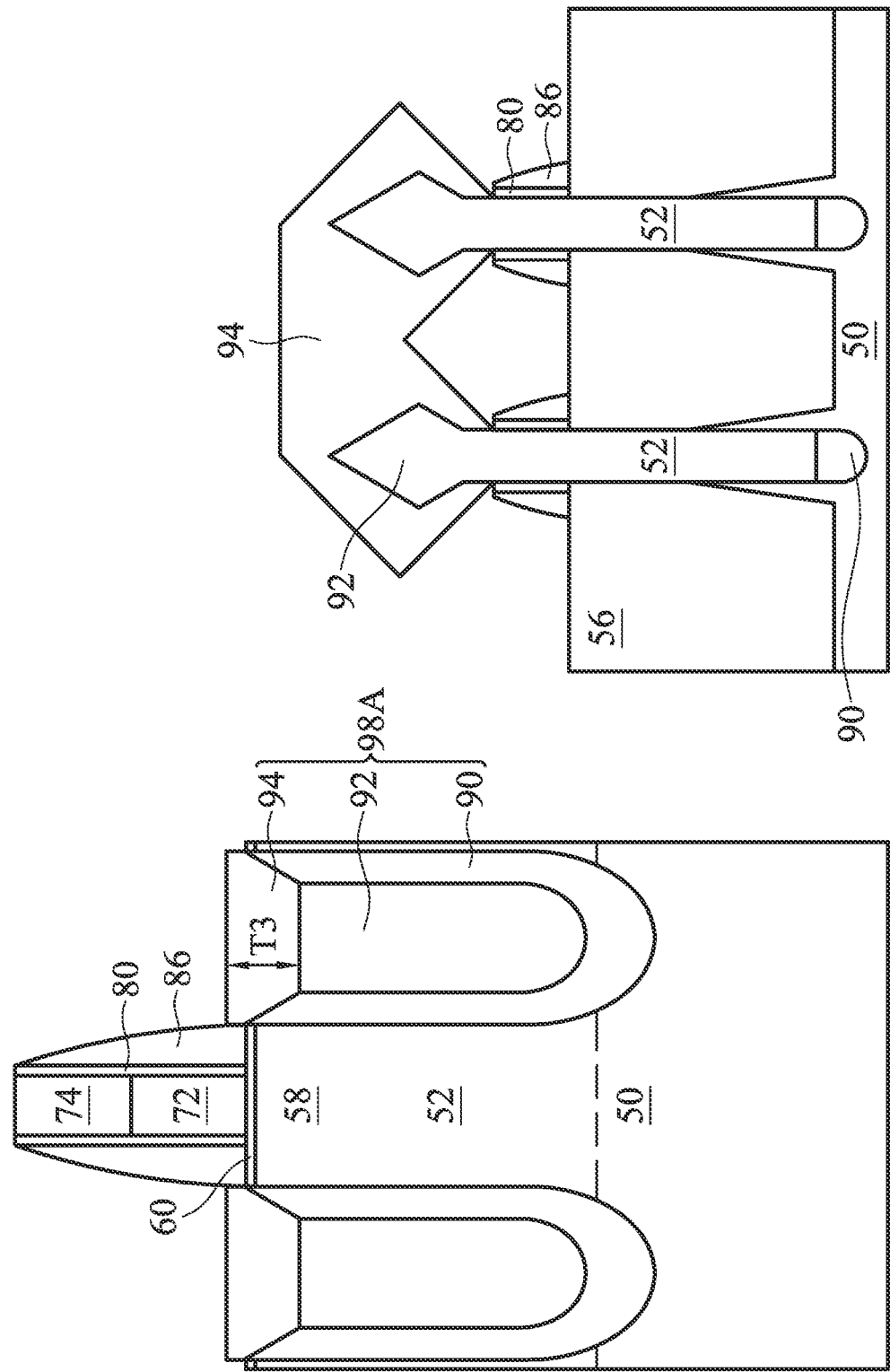
Figure 13C:
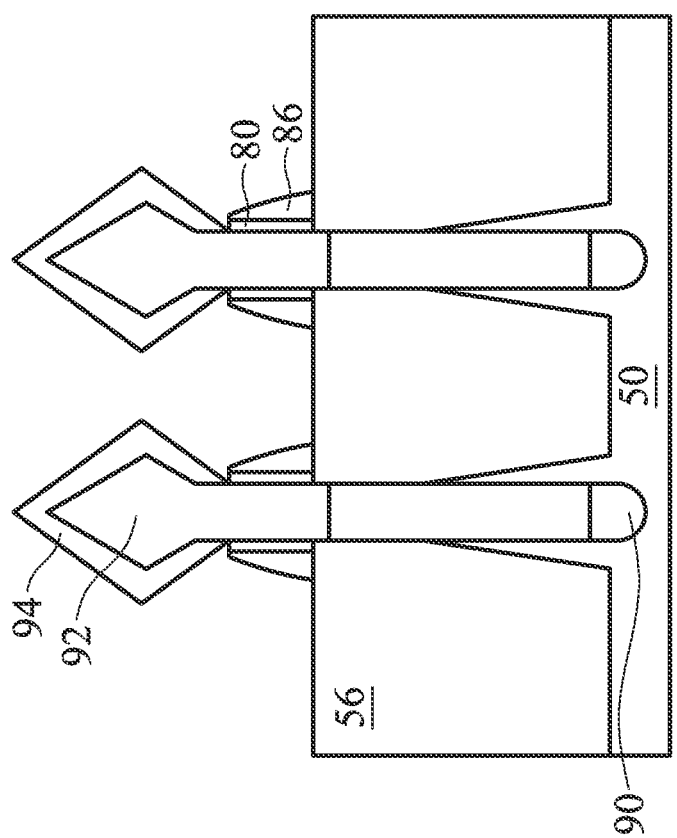

In FIGS. 13A-C, a third source/drain layer 94 is epitaxially grown in the recesses 88 over the second source/drain layer 92 to form source/drain regions 98A. The source/drain regions 98A comprise the first source/drain layer 90, the second source/drain layer 92, and the third source/drain layer 94. For example, the third source/drain layer 94 may comprise materials exerting a compressive strain in the channel region 58, such as SiGe, SiGeB, Ge, GeSn, or the like. In some embodiments, the third source/drain layer 94 is formed from silicon germanium, which may be doped or undoped. In some embodiments, the third source/drain layer 94 may comprise silicon germanium having an atomic percentage of germanium that is between about 0% and about 40%. The third source/drain layer 94 may be implanted with dopants using in situ doping during growth, or using a process similar to the process previously discussed for forming lightly-doped source/drain regions, followed by an anneal. For example, the third source/drain layer 94 may have a concentration of dopants that is between about 5E19 atoms/cm$^3$ and about 1E21 atoms/cm$^3$. The dopants may include p-type impurities such as boron, BF$_2$, indium, or the like.

The third source/drain layer 94 may have surfaces raised from respective surfaces of the fins 52 and may have facets. Further, the epitaxial growth processes used to form the third source/drain layer 94 may cause adjacent third source/drain layers 94 to merge, as illustrated in FIG. 13B. As further illustrated in FIG. 13B, an uppermost surface of the third source/drain layer 94 extending between adjacent fins 52 may be substantially flat. In other embodiments, the uppermost surface of the third source/drain layer 94 may include a valley or recess between the adjacent fins 52. Although the source/drain regions 98A are illustrated in FIG. 13B as being merged, in some embodiments, such as the embodiment illustrated in FIG. 13C, the source/drain regions 98A may remain separated after the epitaxy process is completed.

In some embodiments, the source/drain regions 98A formed in the fins 52 exert stress in the respective channel regions 58, thereby improving performance. The source/drain regions 98A are formed in the fins 52 such that each dummy gate 72 is disposed between respective neighboring pairs of the source/drain regions 98A. In some embodiments the source/drain regions 98A may extend into, and may also penetrate through, the fins 52. In some embodiments, the gate spacers 86 are used to separate the source/drain regions 98A from the dummy gates 72 by an appropriate lateral distance so that the source/drain regions 98A do not short out subsequently formed gates of the resulting FinFETs.

In FIGS. 14A-14C, source/drain regions 98B are formed in the fins 52 in the region 50N. The source/drain regions 98B may be formed by conventional methods. In some embodiments, the source/drain regions 98B in the region 50N, e.g., the NMOS region, may be formed by masking the region 50P, e.g., the PMOS region, and etching source/drain regions of the fins 52 in the region 50N to form recesses in the fins 52. Then, the source/drain regions 98B in the region 50N are epitaxially grown in the recesses. The source/drain regions 98B may include any acceptable material, such as appropriate for n-type FinFETs. For example, if the fin 52 is silicon, the source/drain regions 98B in the region 50N may include materials exerting a tensile strain in the channel region 58, such as silicon, silicon carbide, phosphorous doped silicon carbide, silicon phosphide, or the like. The source/drain regions 98B in the region 50N may have surfaces raised from respective surfaces of the fins 52 and may have facets.

Figure 15B:
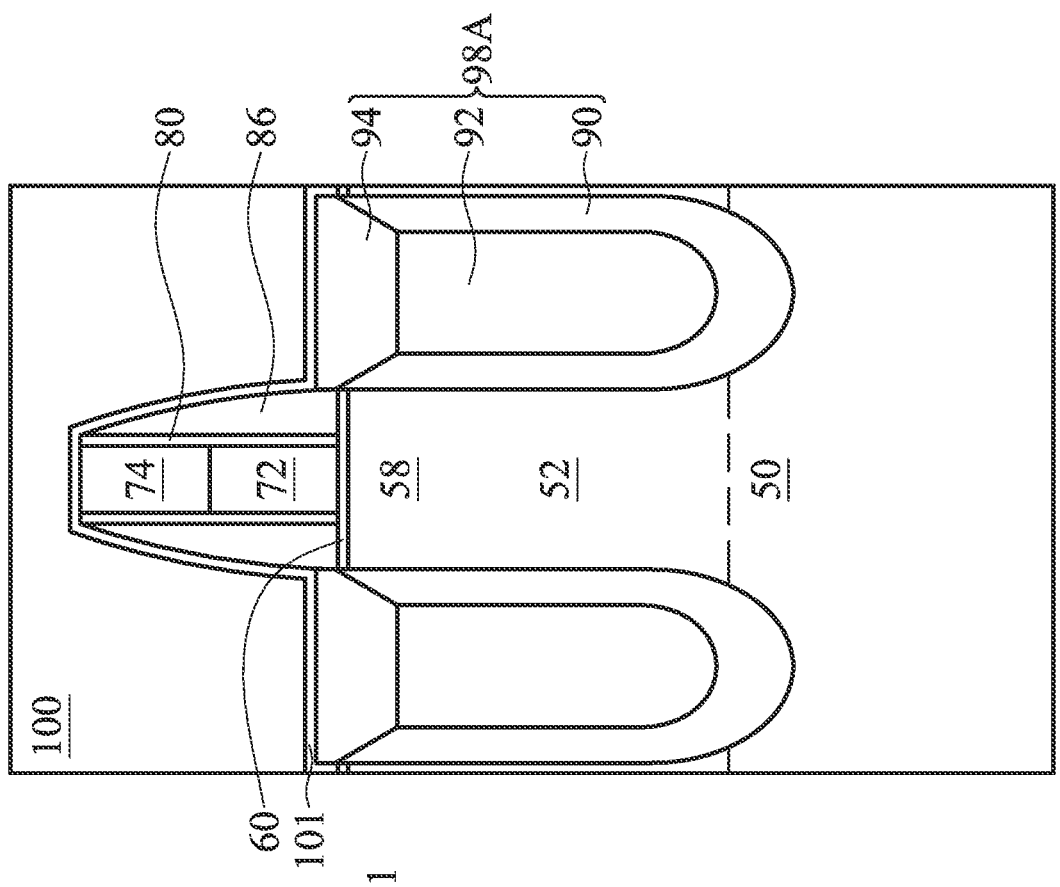
Figure 15A:
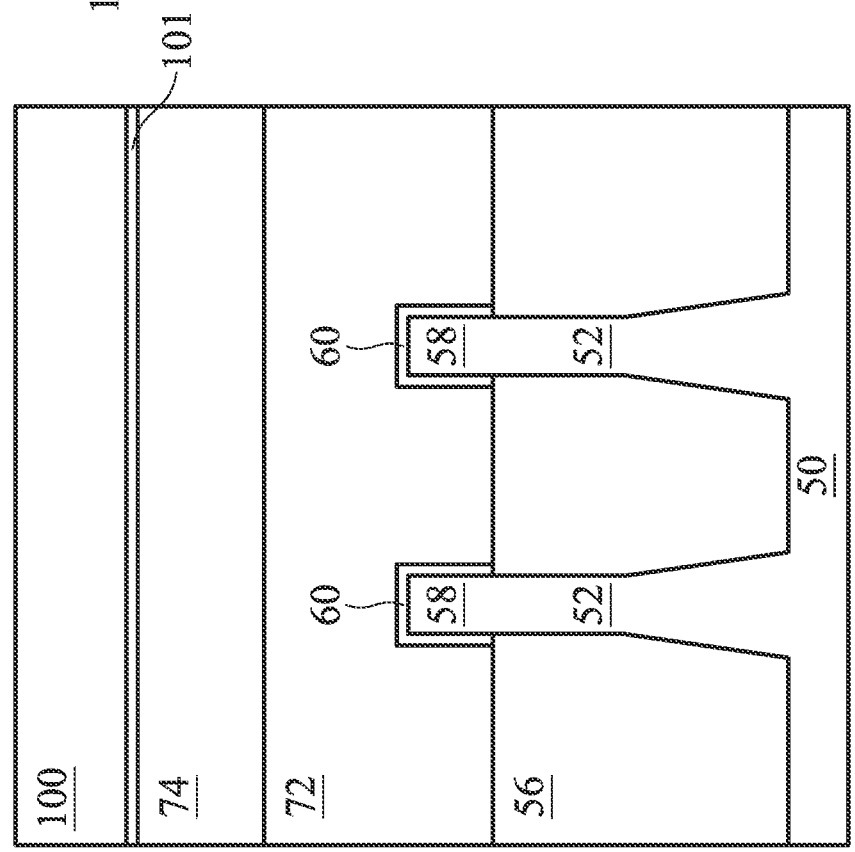

In FIGS. 15A and 15B, a first interlayer dielectric (ILD) 100 is deposited over the structure illustrated in FIGS. 13A-C and 14A-C. The first ILD 100 may be formed of a dielectric material, and may be deposited by any suitable method, such as CVD, plasma-enhanced CVD (PECVD), or FCVD. Dielectric materials may include phospho-silicate glass (PSG), boro-silicate glass (BSG), boron-doped phospho-silicate glass (BPSG), undoped silicate glass (USG), or the like. Other insulation materials formed by any acceptable process may be used. In some embodiments, a contact etch stop layer (CESL) 101 is disposed between the first ILD 100 and the source/drain regions 98A and 98B, the masks 74, and the gate spacers 86. The CESL 101 may comprise a dielectric material, such as, silicon nitride, silicon oxide, silicon oxynitride, or the like, having a different etch rate than the material of the overlying first ILD 100.

Figures 16A, 16B:
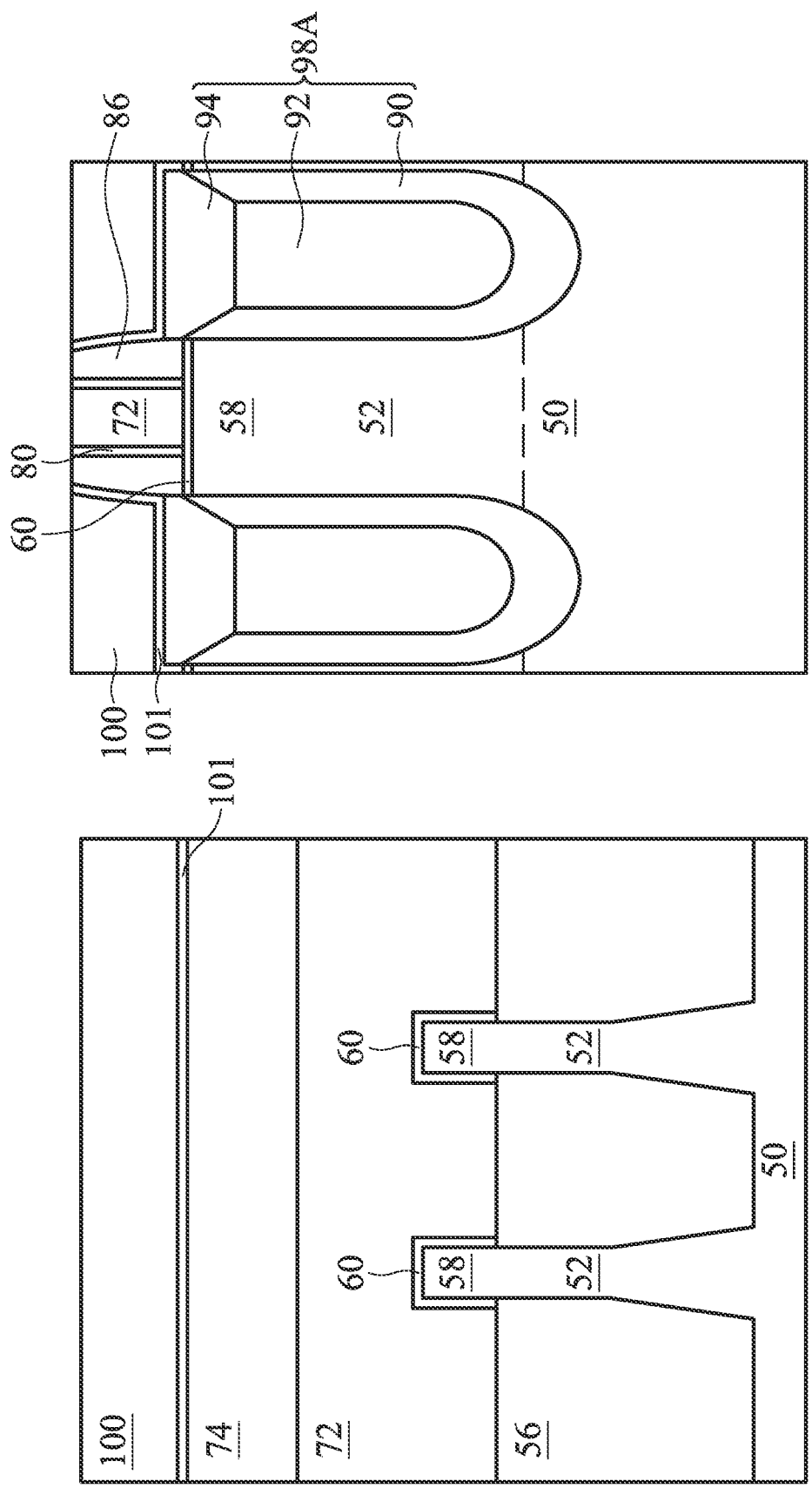

In FIGS. 16A and 16B, a planarization process, such as a CMP, may be performed to level the top surface of the first ILD 100 with the top surfaces of the dummy gates 72 or the masks 74. The planarization process may also remove the masks 74 on the dummy gates 72, and portions of the gate seal spacers 80 and the gate spacers 86 along sidewalls of the masks 74. After the planarization process, top surfaces of the dummy gates 72, the gate seal spacers 80, the gate spacers 86, and the first ILD 100 are level. Accordingly, the top surfaces of the dummy gates 72 are exposed through the first ILD 100. In some embodiments, the masks 74 may remain, in which case the planarization process levels the top surface of the first ILD 100 with the top surfaces of the masks 74.

Figure 17B:
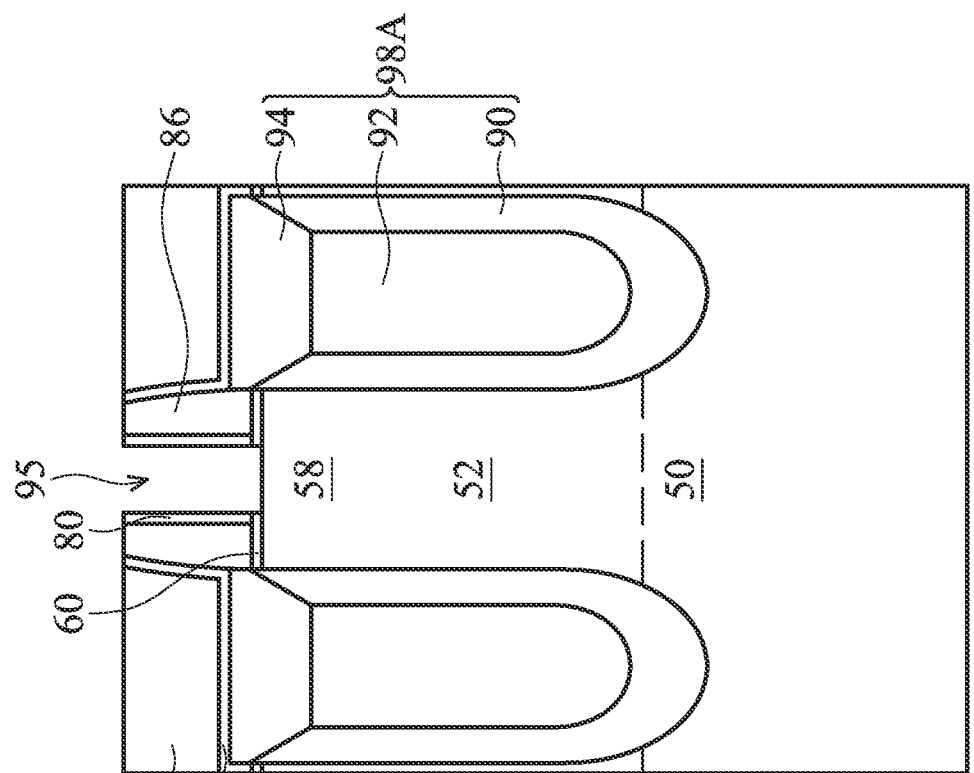
Figure 17A:
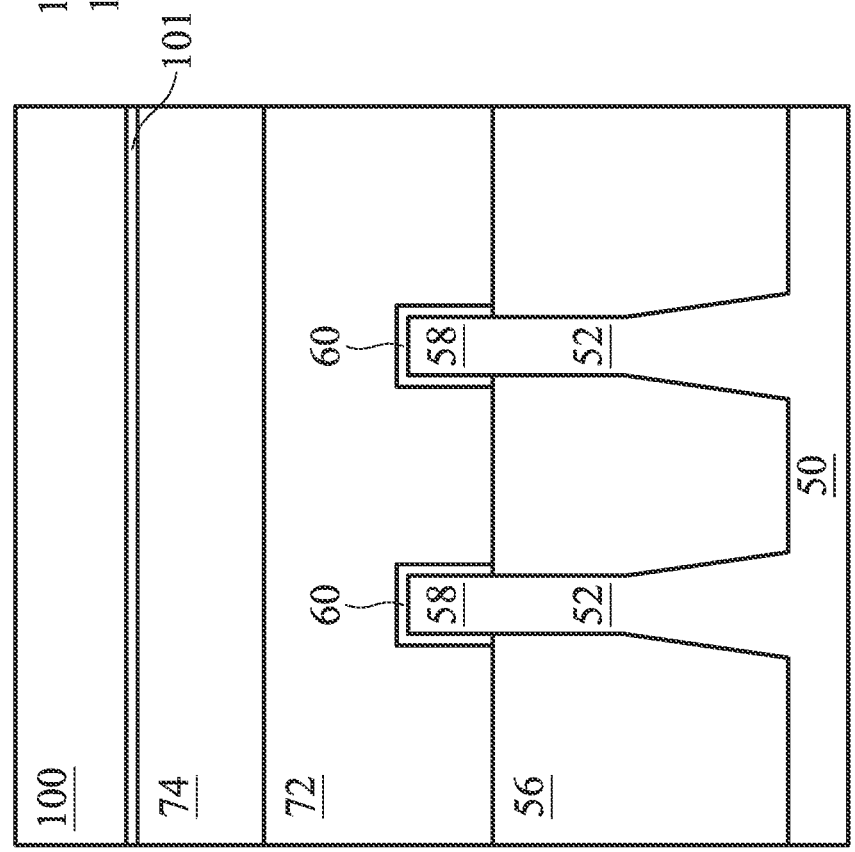

In FIGS. 17A and 17B, the dummy gates 72, and the masks 74 if present, are removed in an etching step(s), so that recesses 95 are formed. Portions of the dummy dielectric layer 60 in the recesses 95 may also be removed. In some embodiments, only the dummy gates 72 are removed and the dummy dielectric layer 60 remains and is exposed by the recesses 95. In some embodiments, the dummy dielectric layer 60 is removed from recesses 95 in a first region of a die (e.g., a core logic region) and remains in recesses 95 in a second region of the die (e.g., an input/output region). In some embodiments, the dummy gates 72 are removed by an anisotropic dry etch process. For example, the etching process may include a dry etch process using reaction gas(es) that selectively etch the dummy gates 72 without etching the first ILD 100 or the gate spacers 86. Each recess 95 exposes and/or overlies a channel region 58 of a respective fin 52. Each channel region 58 is disposed between neighboring pairs of the source/drain regions 98A or 98B. During the removal, the dummy dielectric layer 60 may be used as an etch stop layer when the dummy gates 72 are etched. The dummy dielectric layer 60 may then be optionally removed after the removal of the dummy gates 72.

Figure 18B:
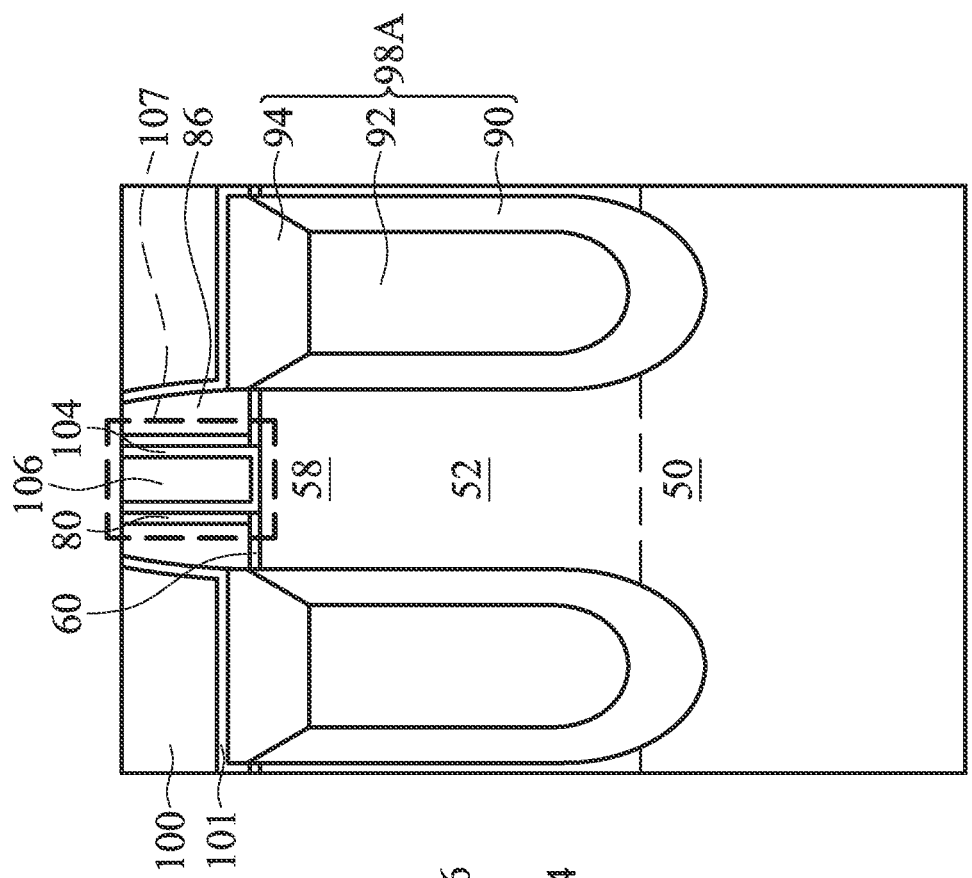
Figure 18A:
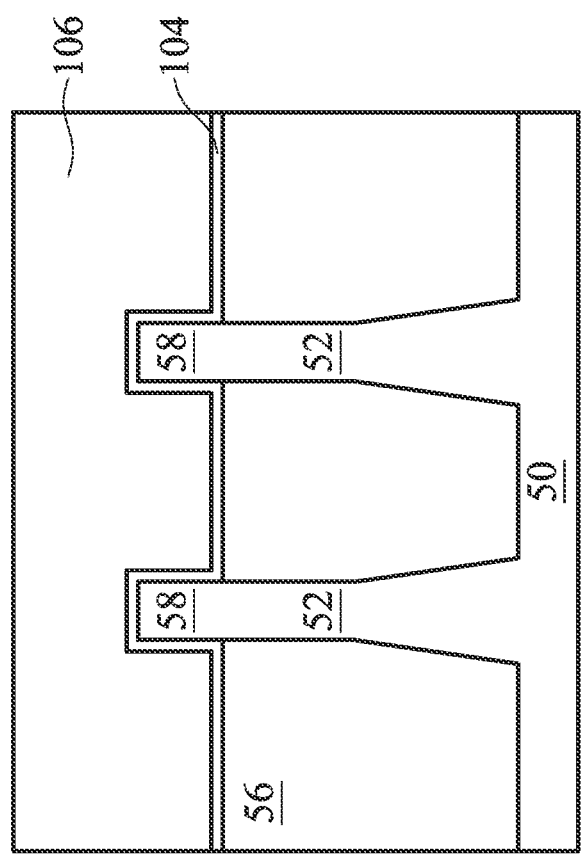
Figure 18C:
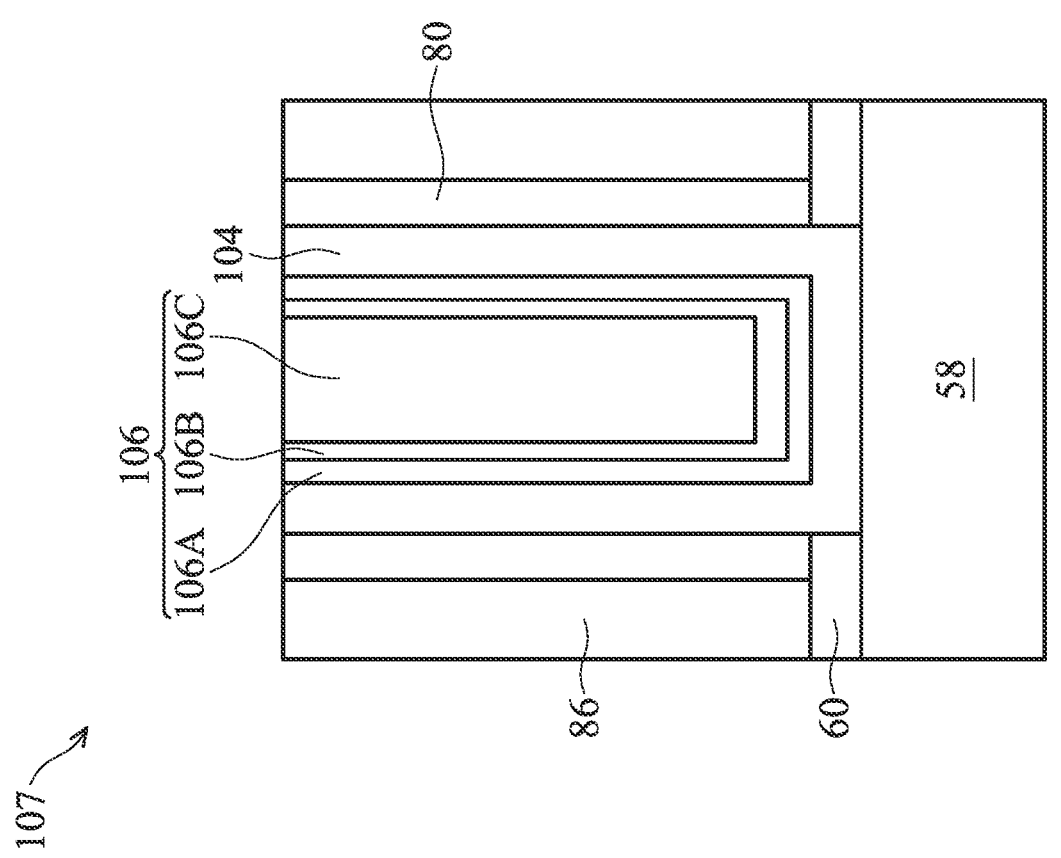

In FIGS. 18A and 18B, gate dielectric layers 104 and gate electrodes 106 are formed for replacement gates. FIG. 18C illustrates a detailed view of region 107 of FIG. 18B. Gate dielectric layers 104 are deposited conformally in the recesses 95, such as on the top surfaces and the sidewalls of the fins 52 and on sidewalls of the gate seal spacers 80/gate spacers 86. The gate dielectric layers 104 may also be formed on the top surface of the first ILD 100. In accordance with some embodiments, the gate dielectric layers 104 comprise silicon oxide, silicon nitride, or multilayers thereof. In some embodiments, the gate dielectric layers 104 include a high-k dielectric material, and in these embodiments, the gate dielectric layers 104 may have a k value greater than about 7.0, and may include a metal oxide or a silicate of hafnium, aluminum, zirconium, lanthanum, manganese, barium, titanium, lead, and combinations thereof. The formation methods of the gate dielectric layers 104 may include Molecular-Beam Deposition (MBD), ALD, PECVD, and the like. In embodiments where portions of the dummy gate dielectric 60 remains in the recesses 95, the gate dielectric layers 104 include a material of the dummy gate dielectric 60 (e.g., SiO$_2$).

The gate electrodes 106 are deposited over the gate dielectric layers 104, respectively, and fill the remaining portions of the recesses 95. The gate electrodes 106 may include a metal-containing material such as titanium nitride, titanium oxide, tantalum nitride, tantalum carbide, cobalt, ruthenium, aluminum, tungsten, combinations thereof, or multi-layers thereof. For example, although a single layer gate electrode 106 is illustrated in FIG. 18B, the gate electrode 106 may comprise any number of liner layers 106 A, any number of work function tuning layers 106 B, and a fill material 106 C as illustrated by FIG. 18C. After the filling of the recesses 95, a planarization process, such as a CMP, may be performed to remove the excess portions of the gate dielectric layers 104 and the material of the gate electrodes 106, which excess portions are over the top surface of the ILD 100. The remaining portions of material of the gate electrodes 106 and the gate dielectric layers 104 thus form replacement gates of the resulting FinFETs. The gate electrodes 106 and the gate dielectric layers 104 may be collectively referred to as a "gate stack." The gate and the gate stacks may extend along sidewalls of a channel region 58 of the fins 52.

The formation of the gate dielectric layers 104 in the region 50N and the region 50P may occur simultaneously such that the gate dielectric layers 104 in each region are formed from the same materials, and the formation of the gate electrodes 106 may occur simultaneously such that the gate electrodes 106 in each region are formed from the same materials. In some embodiments, the gate dielectric layers 104 in each region may be formed by distinct processes, such that the gate dielectric layers 104 may be different materials, and/or the gate electrodes 106 in each region may be formed by distinct processes, such that the gate electrodes 106 may be different materials. Various masking steps may be used to mask and expose appropriate regions when using distinct processes.

Figure 19B:
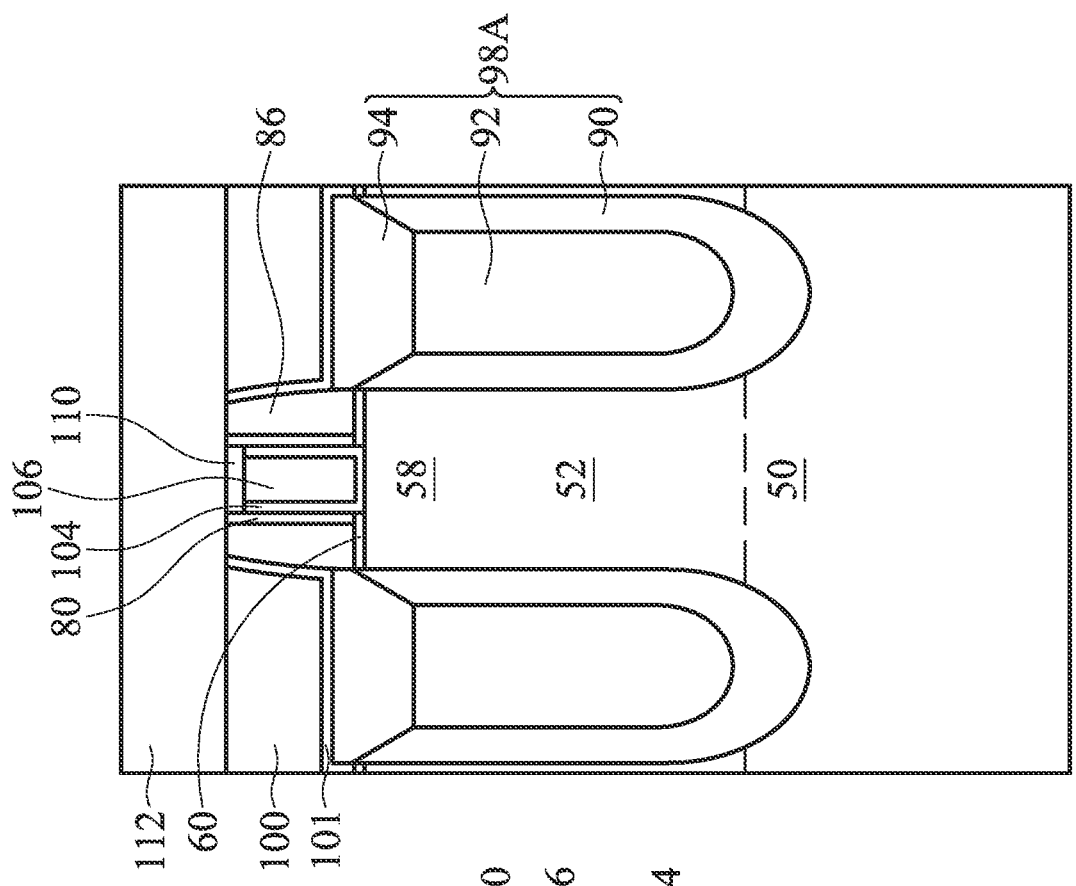
Figure 19A:
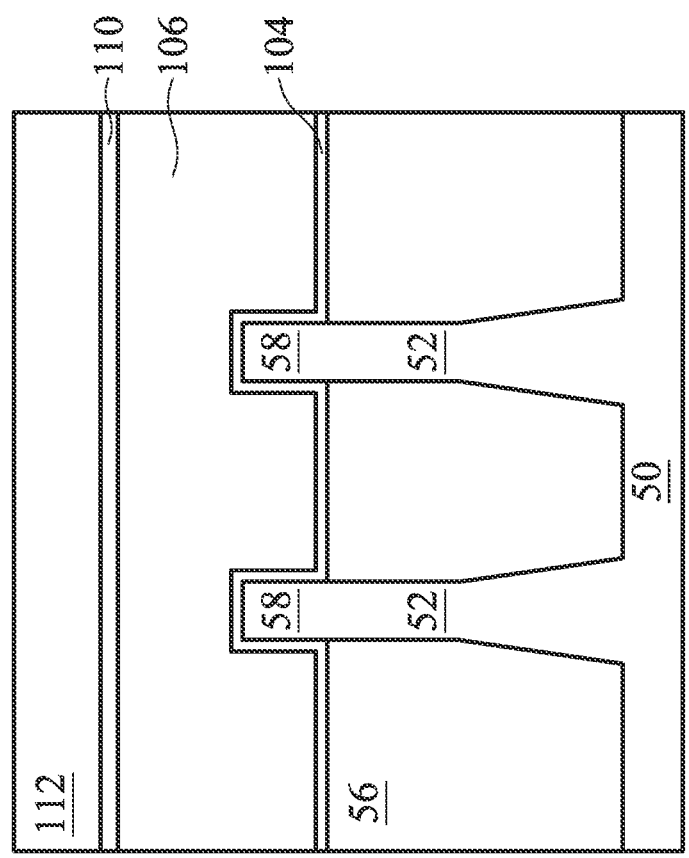

In FIGS. 19A and 19B, a second ILD 112 is deposited over the first ILD 100. In some embodiment, the second ILD 112 is a flowable film formed by a flowable CVD method. In some embodiments, the second ILD 112 is formed of a dielectric material such as PSG, BSG, BPSG, USG, or the like, and may be deposited by any suitable method, such as CVD and PECVD. In accordance with some embodiments, before the formation of the second ILD 112, the gate stack (including a gate dielectric layer 104 and a corresponding overlying gate electrode 106) is recessed, so that a recess is formed directly over the gate stack and between opposing portions of gate spacers 86, as illustrated in FIGS. 19A and 19B. A gate mask 110 comprising one or more layers of dielectric material, such as silicon nitride, silicon oxynitride, or the like, is filled in the recess, followed by a planarization process to remove excess portions of the dielectric material extending over the first ILD 100. The subsequently formed gate contacts 114 (see FIGS. 20A-B) penetrate through the gate mask 110 to contact the top surface of the recessed gate electrode 106.

Figure 20B:
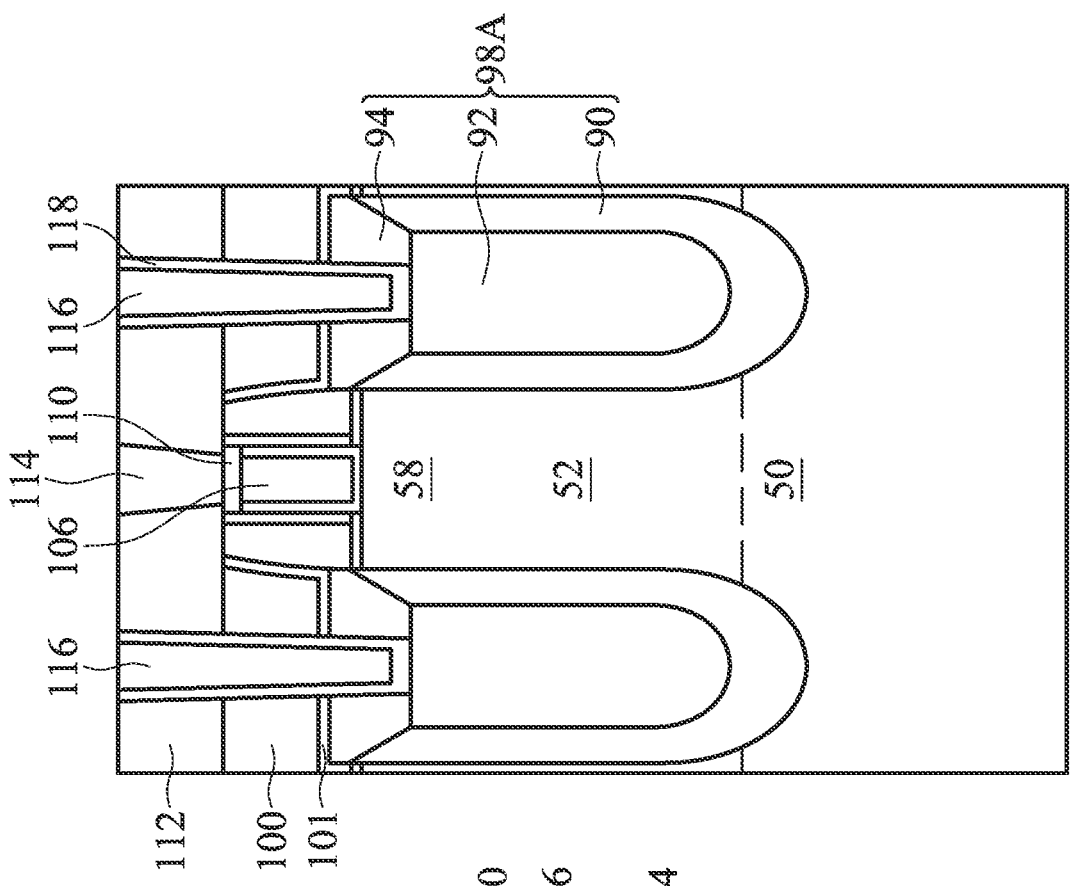
Figure 20A:
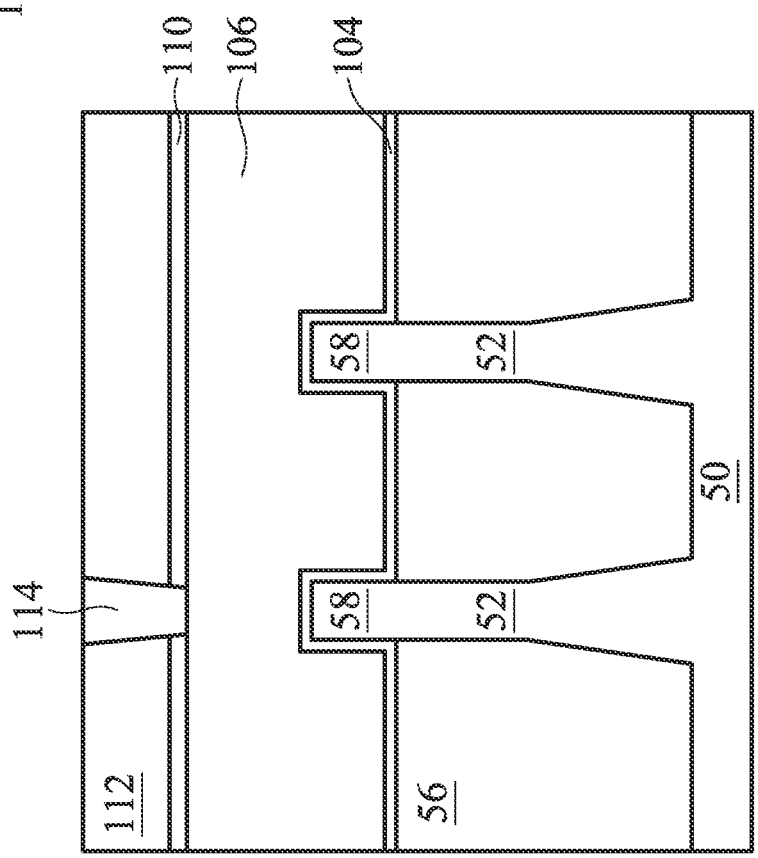

In FIGS. 20A, 20B and 20C, gate contacts 114 and source/drain contacts 116 are formed through the second ILD 112 and the first ILD 100 in accordance with some embodiments. Openings for the source/drain contacts 116 are formed through the first and second ILDs 100 and 112, and openings for the gate contact 114 are formed through the second ILD 112 and the gate mask 110. The openings may be formed using acceptable photolithography and etching techniques. A liner, such as a diffusion barrier layer, an adhesion layer, or the like, and a conductive material are formed in the openings. The liner may include titanium, titanium nitride, tantalum, tantalum nitride, or the like. The conductive material may be copper, a copper alloy, silver, gold, tungsten, cobalt, aluminum, nickel, or the like. A planarization process, such as a CMP, may be performed to remove excess material from a surface of the ILD 112. The remaining liner and conductive material form the source/drain contacts 116 and gate contacts 114 in the openings. An anneal process may be performed to form a silicide at the interface between the source/drain regions 98A or 98B and the source/drain contacts 116. The source/drain contacts 116 are physically and electrically coupled to the source/drain regions 98A or 98B, and the gate contacts 114 are physically and electrically coupled to the gate electrodes 106. The source/drain contacts 116 and gate contacts 114 may be formed in different processes, or may be formed in the same process. Although shown as being formed in the same cross-sections, it should be appreciated that each of the source/drain contacts 116 and gate contacts 114 may be formed in different cross-sections, which may avoid shorting of the contacts.

In some cases, forming a deeper source/drain recess in the fin of a FinFET device allows for a larger volume of the epitaxial source/drain regions, which can improve the turn-on current of the FinFET device. For example, in some cases a source/drain recess that extends through the fin and into the substrate can increase the turn-on current by as much as about 10%. However, source/drain regions that extend deeper can also cause an increase in leakage from the source/drain regions into the fin or substrate due to dopant diffusion. In some cases, when forming a first layer of silicon germanium in a source/drain region, increasing the atomic percentage of germanium can reduce out-diffusion of dopants (e.g., boron) from the source/drain regions. Additionally, by decreasing the doping concentration of the first layer of silicon germanium can also reduce the amount of dopants that diffuse into the fins or substrate. In this manner, the leakage current due to dopant diffusion can be reduced by as much as 5%. Thus, by forming a first layer of silicon germanium as described, deeper source/drain recesses may be used, and the turn-on current may be increased without also increasing the leakage current of a FinFET device.

In accordance with an embodiment, a method includes forming a semiconductor fin over a semiconductor substrate, etching the semiconductor fin to form a recess, wherein the recess extends into the semiconductor substrate, and forming a source/drain region in the recess, wherein forming the source/drain region includes epitaxially growing a first semiconductor material on sidewalls of the recess, wherein the first semiconductor material includes silicon germanium, wherein the first semiconductor material has a first germanium concentration from 10 to 40 atomic percent, epitaxially growing a second semiconductor material over the first semiconductor material, the second semiconductor material including silicon germanium, wherein the second semiconductor material has a second germanium concentration that is greater than the first germanium concentration, and epitaxially growing a third semiconductor material over the second semiconductor material, the third semiconductor material including silicon germanium, wherein the third semiconductor material has a third germanium concentration that is smaller than the second germanium concentration. In an embodiment, the first semiconductor material comprises boron-doped silicon germanium having a boron concentration between $1\times10^{19}$ atoms/cm$^3$ and $1\times10^{21}$ atoms/cm$^3$. In an embodiment, the second semiconductor material comprises boron-doped silicon germanium having a germanium concentration from 20 to 80 atomic percent. In an embodiment, the first semiconductor material is epitaxially grown having a thickness on the sidewalls of the first recess that is between 1 nm and 10 nm. In an embodiment, the recess extends into the substrate a distance between 0 nm and 10 nm. In an embodiment, the semiconductor fin includes silicon germanium. In an embodiment, the substrate includes doped silicon having a boron concentration between $1\times10^{17}$ atoms/cm$^3$ and $1\times10^{20}$ atoms/cm$^3$.

In accordance with an embodiment, a device includes a fin extending from a substrate, the fin having a top surface that is a first height from a top surface of the substrate, a gate stack over the fin, a source/drain region in the fin adjacent the gate stack and in the substrate, wherein a bottom surface of the source/drain region is below the top surface of the substrate and wherein a top surface of the source/drain region is above the top surface of the fin, the source/drain region including a first source/drain material including silicon germanium having a first concentration of germanium and a first concentration of boron, a second source/drain material over the first source/drain material, the second source/drain including silicon germanium having a second concentration of germanium and a second concentration of boron, wherein the second concentration of germanium is greater than the first concentration of germanium and wherein the second concentration of boron is greater than the first concentration of boron, and a third source/drain material over the second source/drain material, the third source/drain material including silicon germanium having a third concentration of germanium and a third concentration of boron. In an embodiment, the bottom surface of the source/drain region is at a depth of 0 nm to 10 nm below the top surface of the substrate. In an embodiment, the top surface of the fin is at a height of 30 nm to 70 nm above the top surface of the substrate. In an embodiment, the fin includes silicon germanium and the substrate includes silicon. In an embodiment, the fin has a concentration of germanium that is between 10 atomic percent and 50 atomic percent. In an embodiment, the first concentration of germanium is between 10 atomic percent and 40 atomic percent. In an embodiment, the first concentration of boron is between $1\times10^{19}$ atoms/cm$^3$ and $1\times10^{21}$ atoms/cm$^3$. In an embodiment, the second concentration of boron is 10 times the first concentration of boron.

In accordance with an embodiment, a method includes forming a fin extending from a substrate, the fin having a first height above a surface of the substrate, etching the fin to form an opening, wherein the opening has a depth that is greater than the first height of the fin, and forming a source/drain region in the opening, wherein forming the source/drain region includes epitaxially growing a first semiconductor material in the opening, wherein a portion of the first semiconductor material extends below the surface of the substrate, wherein the first semiconductor material includes doped silicon germanium, epitaxially growing a second semiconductor material over the first semiconductor material, wherein the first semiconductor material includes doped silicon germanium having a greater dopant concentration and a greater atomic percent of germanium than the first semiconductor material, and epitaxially growing a third semiconductor material over the second semiconductor, wherein the third semiconductor material includes doped silicon germanium having a smaller dopant concentration and a smaller atomic percent of germanium than the second semiconductor material. In an embodiment, the depth of the opening is between 0 nm and 10 nm greater than the first height of the fin. In an embodiment, epitaxially growing the first semiconductor material includes growing the first semiconductor material to a thickness that is greater than a difference between the depth of the opening and the first height of the fin. In an embodiment, the first semiconductor material includes between 10 atomic percent and 40 atomic percent germanium and the first semiconductor material has a doping concentration that is between $1\times10^{19}$ atoms/cm$^3$ and $1\times10^{21}$ atoms/cm$^3$. In an embodiment, the first semiconductor material is doped with boron.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A device comprising:
   a fin extending from a substrate, the fin having a top surface that is a first height from a top surface of the substrate;
   a gate stack over the fin;
   a source/drain region in the fin adjacent the gate stack and in the substrate, wherein a bottom surface of the source/drain region is below the top surface of the substrate and wherein a top surface of the source/drain region is above the top surface of the fin, the source/drain region comprising:
   a first source/drain material comprising silicon germanium having a first concentration of germanium and a first concentration of boron;
   a second source/drain material over the first source/drain material, the second source/drain material comprising silicon germanium having a second concentration of germanium and a second concentration of boron, wherein the second concentration of germanium is greater than the first concentration of germanium and wherein the second concentration of boron is greater than the first concentration of boron; and
   a third source/drain material over the second source/drain material, the third source/drain material comprising silicon germanium having a third concentration of germanium and a third concentration of boron, wherein the third source/drain material physically contacts both the first source/drain material and the second source/drain material.

2. The device of claim 1, wherein the bottom surface of the source/drain region is at a depth of 0 nm to 10 nm below the top surface of the substrate.

3. The device of claim 1, wherein the top surface of the fin is at a height of 30 nm to 70 nm above the top surface of the substrate.

4. The device of claim 1, wherein the fin comprises silicon germanium and the substrate comprises silicon.

5. The device of claim 4, wherein the fin has a concentration of germanium that is between 10 atomic percent and 50 atomic percent.

6. The device of claim 1, wherein the first concentration of germanium is between 10 atomic percent and 40 atomic percent.

7. The device of claim 1, wherein the first concentration of boron is between $1\times10^{19}$ atoms/cm$^3$ and $1\times10^{21}$ atoms/cm$^3$.

8. The device of claim 1, wherein the second concentration of boron is 10 times the first concentration of boron.

9. A device comprising:
   a fin extending from a substrate, the fin having an upper surface that is a first height from an upper surface of the substrate;
   a gate stack over the fin;
   a source/drain region in the fin adjacent the gate stack and in the substrate, the source/drain region comprising:
   a first source/drain material comprising silicon germanium having a first concentration of germanium and a first concentration of boron, wherein the first source/drain material extends lower than a bottom of the fin;
   a second source/drain material over the first source/drain material, the second source/drain material comprising silicon germanium having a second concentration of germanium and a second concentration of boron, wherein the second concentration of germanium is greater than the first concentration of germanium and wherein the second concentration of boron is greater than the first concentration of boron, wherein an upper surface of the second source/drain material is below an upper surface of the first source/drain material; and
   a third source/drain material over the second source/drain material, the third source/drain material comprising silicon germanium having a third concentration of germanium and a third concentration of boron, wherein an upper surface of the third source/drain material protrudes above the upper surface of the fin.

10. The device of claim 9, wherein the second source/drain material is entirely above the bottom of the fin.

11. The device of claim 10, wherein the second source/drain material is entirely below the upper surface of the fin.

12. The device of claim 9, wherein the substrate comprises a silicon substrate having a boron concentration between $1\times10^{17}$ atoms/cm$^3$ and $1\times10^{20}$ atoms/cm$^3$, wherein the first source/drain material contacts the silicon substrate.

13. The device of claim 9, wherein a thickness of the first source/drain material is in a range between 3 nm and 20 nm at the bottom of the first source/drain material.

14. The device of claim 9, wherein the source/drain region has a depth of 0 nm to 10 nm below the upper surface of the substrate.

15. A device comprising:
   a fin extending from a substrate, the fin having a top surface that is a first height from a top surface of the substrate;
   a gate stack over the fin;
   a source/drain region in the fin adjacent the gate stack and in the substrate, wherein a bottom surface of the source/drain is below the top surface of the substrate, wherein a top surface of the source/drain region is above the top surface of the fin, wherein the source/drain region has a second height extending from the bottom surface of the source/drain region to the top surface of the source/drain region, the second height being greater than the first height, the source/drain region comprising:
   a first source/drain material over the substrate and along a sidewall of the fin;
   a second source/drain material over the first source/drain material, wherein the first source/drain material separates the second source/drain material from the fin and the substrate, wherein an upper surface of the second source/drain material is below an upper surface of the fin, wherein the upper surface of the second source/drain material is below an upper surface of the first source/drain material; and a third source/drain material over the second source/drain material, wherein an upper surface of the third source/drain material protrudes above the upper surface of the fin.

16. The device of claim 15, wherein a bottom surface of the second source/drain material is higher than an upper surface of the substrate.

17. The device of claim 15, wherein the first source/drain material comprises silicon germanium having a first concentration of germanium and a first concentration of boron, wherein the second source/drain material comprises silicon germanium having a second concentration of germanium and a second concentration of boron, wherein the second concentration of germanium is greater than the first concentration of germanium and wherein the second concentration of boron is greater than the first concentration of boron, wherein the third source/drain material comprises silicon germanium having a third concentration of germanium and a third concentration of boron.

18. The device of claim 15, wherein a height of the second source/drain material is less than the first height.

19. The device of claim 15, wherein the third source/drain material extends from lower than the upper surface of the fin to above the upper surface of the fin.

20. The device of claim 15, wherein a thickness of the first source/drain material along a bottom of the first source/drain material is between 3 nm and 20 nm.

* * * * *